(12) United States Patent
Kuramoto et al.

(10) Patent No.: US 6,228,167 B1
(45) Date of Patent: May 8, 2001

(54) SINGLE CRYSTAL PULLING APPARATUS

(75) Inventors: Makoto Kuramoto; Tetsuhiro Iida, both of Annaka (JP)

(73) Assignee: Super Silicon Crystal Research Institute Corp., Annaka (JP)

( * ) Notice: Subject to any disclaimer, the term of this patent is extended or adjusted under 35 U.S.C. 154(b) by 0 days.

(21) Appl. No.: 09/297,678

(22) PCT Filed: Sep. 14, 1998

(86) PCT No.: PCT/JP98/04131

§ 371 Date: May 9, 1999

§ 102(e) Date: May 6, 1999

(87) PCT Pub. No.: WO99/15717

PCT Pub. Date: Apr. 1, 1999

(30) Foreign Application Priority Data

Sep. 22, 1997 (JP) .................................................... 9-275284
Sep. 30, 1997 (JP) .................................................... 9-282916

(51) Int. Cl.[7] .............................. C30B 15/00; C30B 15/30
(52) U.S. Cl. ........................... 117/208; 117/218; 117/911; 117/932
(58) Field of Search .................................. 117/208, 218, 117/911, 932

(56) References Cited

U.S. PATENT DOCUMENTS

| | | | |
|---|---|---|---|
| 5,126,113 | * 6/1992 | Yamagishi et al. | 117/218 |
| 5,879,448 | * 3/1999 | Urano et al. | 117/13 |
| 5,932,007 | * 8/1999 | Li | 117/208 |
| 6,042,644 | * 3/2000 | Kurosaka et al. | 117/13 |
| 6,077,348 | * 6/2000 | Shiraishi | 117/218 |

\* cited by examiner

*Primary Examiner*—Robert Kunemund
*Assistant Examiner*—Donald L. Champagne
(74) *Attorney, Agent, or Firm*—Connolly Bove Lodge & Hutz

(57) ABSTRACT

In the apparatus according to the present invention, self-weight of a single crystal is moved in soft manner when the single crystal being pulled up is gripped by grippers, and driving of pulling operation after self-weight movement is performed by a single driving source, and it is aimed to prevent contamination and dislocation of the single crystal by arranging all driving units outside a vacuum chamber for storing the single crystal. There is provided a support member 70 for supporting a portion with larger diameter 5 under a seed crystal 3, and the support member 70 is provided with a through-hole, which is communicated with outer peripheral portion via a slit 74, and it can be rotated in horizontal direction between a non-holding position and a holding position by the motor 40. Position of the support member 70 is controlled in vertical direction with respect to the seed crystal holder 2, and when it is out of vertical position control operation, the support member 70 is integrally moved with the seed crystal holder 2 in vertical direction by transmitting motive power of the seed crystal pulling means 20, and the driving sources are arranged outside the vacuum chamber for storing single crystal.

41 Claims, 11 Drawing Sheets

TO CRYSTAL ROTATING MECHANISM

TO SEED CRYSTAL HOLDER

TO CRYSTAL ROTATING MECHANISM

TO SEED CRYSTAL HOLDER

SINGLE CRYSTAL PULLING APPARATUS

TECHNICAL FIELD

The present invention relates to a single crystal pulling apparatus for producing a dislocation-free single crystal of silicon (Si) by the pulling Czochralski method.

BACKGROUND ART

In general, in a single crystal manufacturing apparatus based on the pulling Czochralski method, the pressure inside a highly pressure proof airtight chamber is reduced to about 10 torr and fresh argon (Ar) gas is sent into it. Then, polycrystal in a quartz crucible placed in the lower portion of the chamber is heated and melted. Then, seed crystal is immersed into the surface of the melt from above, and the seed crystal is pulled while rotating and moving up and down the seed crystal and the quartz crucible. As a result, a single crystal (the so-called ingot) is grown, which comprises an upper cone portion in conical shape with its upper end protruding below the seed crystal, a body portion in cylindrical shape, and a lower cone portion in conical shape with its lower end protruding.

As the growing method, Dash method is known, in which a seed crystal is immersed into the surface of the melt to exclude dislocation (to turn to dislocation-free) which occurs to the seed crystal by thermal shock when the seed crystal is immersed in the surface of the melt. Then, pulling rate is relatively increased to form a neck portion with diameter smaller than the-diameter of the seed crystal, e.g. 3–4 mm, and pulling of the upper cone portion is started.

Because it is not possible to pull single crystal of larger diameter and heavier weight (150–200 kg or more) via the neck portion with small diameter, a method has been proposed, for example, in the Japanese Patent Publication 5-65477. According to this method, a neck portion with smaller diameter is formed by Dash method, and pulling rate is then relatively slowed down to form a portion with larger diameter. Then, the pulling rate is relatively increased to form a portion with smaller diameter, i.e. to form a "spherical constricted portion", and by gripping the constricted portion by grippers, single crystal of larger diameter and heavier weight is pulled up. Also, as a conventional apparatus for gripping the constricted portion, there are the apparatuses described in the Japanese Patent Publications 7-103000 and 7-515 in addition to the above patent publication.

As the other conventional examples, the following methods have been proposed: a method to grip a body portion without forming the "constricted portion" as shown in the Japanese Patent Publication Laid-Open 5-270974 or 7-172981, or a method to form "an annular constricted portion" with diameter larger than the body portion between the upper cone portion and the body portion and to grip this "annular constricted portion".

However, single crystal pulling process is a process, which is very sensitive to external vibration and which is very likely to cause polycrystal. Therefore, in single crystal pulling operation, there is a problem of how to move self-weight of the crystal in smooth and soft manner to gripping position such as constricted portion or the neck portion. Also, because of high temperature in the pulling furnace, gripping mechanisms and the like must be designed in heat-resistant construction. Further, intermingling of particles (dust) must be avoided as much as possible because this deteriorates quality of the crystal. None of the conventional techniques has definitely solved these problems. In the Japanese Patent Publications Laid-Open 5-270974, 5-270975, and 5-301793, the seed crystal pulling-mechanism and the gripper pulling mechanism have different driving sources, and there is neither disclosure nor suggestion as to how synchronous operation of these mechanisms can be attained.

In the Japanese Patent Publication Laid-Open 9-2893, the seed crystal pulling mechanism and the gripper pulling mechanism have different driving sources, and it is disclosed that these are synchronously operated or independently operated. However, in case of synchronous operation, the control process is complicated, and the apparatus used for control is complicated in structure and high in cost. Further, in the Japanese Patent Publication 7-515, it is disclosed that a vertical moving mechanism for engaging the grippers with constricted portion of single crystal is provided on a shaft to form the seed crystal pulling mechanism. After engagement, the grippers are also pulled up in synchronization with the seed crystal merely by the control of the seed crystal pulling mechanism. However, there is neither disclosure nor suggestion on effective means to stop the engaged portion, and it is difficult to use in practical application. Also, according to the Japanese Patent Publication 7-515 and the Japanese Patent Publication Laid-Open 7-172981, screw units and mechanical driving units in the driving mechanisms have metal components coming into contact with each other, and these are arranged in the pulling furnace maintained at high temperature. For this reason, it is difficult to take heat-resistant measures or mechanical units do not satisfactorily fulfill the function. Further, particles generated from mechanical contact parts may give adverse influence, and this hinders single crystal pulling operation.

According to the Japanese Patent Publication Laid-Open 9-2893, all driving mechanisms are arranged outside the vacuum chamber to avoid the problem of intermingling of particles into the pulling furnace under high temperature condition. By synchronous control of seed crystal pulling rate and gripping mechanism pulling rate, it is attempted to solve all problems found in the conventional type apparatus at once. However, the synchronous control can be achieved by mutually adjusting the pulling rate of wire drum to wind up seed crystal pulling wire and the pulling rate of the pulling drive, to which gripping means are connected. In this respect, the control mechanism and the control process are complicated and the cost for designing and manufacture of the apparatus is high, and it is also difficult to perform maintenance.

DISCLOSURE OF THE INVENTION

To solve the above problems, it is an object of the present invention to provide a single crystal pulling apparatus having relatively simple arrangement and manufactured at low cost, by which it is possible to prevent the single crystal being pulled from turning to polycrystal when it is gripped by grippers, to move self-weight of the crystal from the neck portion to the gripping position such as constricted portion in smooth and soft manner during single crystal pulling operation, and to avoid the problem of the influence of high temperature and of the intermingling of particles.

To attain the above object, according to the present invention, the position of gripping members to be engaged with the portion with larger diameter formed under the seed crystal is controlled in vertical direction with respect to the seed crystal holder, and when it is out of the vertical position control operation, the gripping members are moved integrally with the seed crystal holder in vertical direction by transmitting motive power of the seed crystal pulling means, and the driving mechanisms are arranged outside the vacuum chamber for storing the crucible and the single crystal to be grown.

According to another aspect of the present invention, the portion with larger diameter formed under the seed crystal is supported from below and a support base is used as a dish-like member to hold the portion with larger diameter, position of the support base is controlled in vertical direction with respect to the seed crystal holder, and when it is out of the vertical position control operation, the support base is moved integrally with the seed crystal holder in vertical direction by transmitting motive power of the seed crystal pulling means, and all driving mechanisms are arranged outside the vacuum chamber for storing the crucible and the single crystal to be grown.

The present invention provides a single crystal pulling apparatus, which comprises:

rotating means for rotating a seed crystal holder to support a seed crystal above a crucible capable to hold a melted crystal;

Seed crystal pulling means for pulling up the seed crystal by rate control and pulling of the seed crystal holder;

gripping members rotatable with the seed crystal holder, movable in vertical direction in association with vertical movement of the seed crystal holder having tips thereof opened or closed to grip lower end of a constricted portion formed under a portion with larger diameter under the seed crystal by pulling of the seed crystal pulling means and/or the portion with larger diameter of the single crystal;

crystal holding position control means for controlling position in vertical direction of the gripping members with respect to the seed crystal holder, and when it is out of the vertical position control operation, for moving up the gripping members integrally with the seed crystal holder by transmitting motive power of the seed crystal pulling means; and gripping member opening or closing means for opening or closing forward ends of the gripping members, and for moving tips of the gripping members to the lower portion of the portion with larger diameter so that the lower end of the constricted portion and/or the portion with larger diameter is gripped, whereby:
driving mechanisms of the means are positioned outside the vacuum chamber for storing the crucible and the single crystal to be grown.

Also, the present invention provides a single crystal pulling apparatus, which comprises:

a shaft connected to a seed crystal holder for supporting a seed crystal above a crucible capable to hold a melted crystal;

rotating means for rotating the shaft;

seed crystal pulling means for pulling the seed crystal by rate control and pulling of the shaft;

gripping members rotatable with the shaft, movable in vertical direction in association with vertical movement of the shaft, and having forward ends thereof to grip the lower end of a constricted portion formed under a portion with larger diameter under the crystal seed by pulling of the seed crystal pulling means and/or the portion with larger diameter of the single crystal;

crystal holding position control means for controlling vertical position of the gripping members with respect to the shaft, and when it is out of the vertical position control operation, the gripping members are integrally moved in vertical direction with the shaft by transmitting motive power of the seed crystal pulling means; and gripping member opening or closing means for opening or closing forward ends of the gripping members, and for moving forward ends of the gripping members to the lower portion of the portion with larger diameter so that the lower ends of the constricted portion and/or the portion with larger diameter are gripped when forward ends of the gripping members are closed, whereby:
driving mechanisms of each of the means are positioned outside the vacuum chamber for storing the crucible and the single crystal to be grown.

Further, the present invention provides a single crystal pulling apparatus, which comprises:

rotating means for rotating a seed crystal holder for supporting a seed crystal above a crucible capable to hold a melted crystal;

seed crystal pulling means for pulling the seed crystal by rate control and pulling of the seed crystal holder.

a support base capable to rotate with the seed crystal holder, movable in vertical direction in association with vertical movement of the seed crystal holder, and being provided with a through-hole to allow a constricted portion to pass and with a slit to communicate the through-hole with outer peripheral portion to guide the constricted portion toward the through-hole in order to support the lower end of the constricted portion formed under a portion with larger diameter under the seed crystal by pulling of the seed crystal pulling means and/or the portion with larger diameter of the single crystal;

crystal holding position control means for controlling vertical position of the support base with respect to the position in vertical direction of the seed crystal holder, and when it is out of position control operation, the support base is moved in vertical direction integrally with the seed crystal holder by transmitting motive power of the seed crystal pulling means; and support base moving means for moving the support base between a first position not to support the lower end of the constricted portion and/or the portion with larger diameter and a second position to support the lower end of the constricted portion and/or the portion with larger diameter, whereby:
driving mechanisms of each of the means are positioned outside the vacuum chamber for storing the crucible and the single crystal to be grown.

Also, the present invention provides a single crystal pulling apparatus, which comprises:

a shaft connected to a seed crystal holder for supporting a seed crystal above a crucible capable to hold a melted crystal;

rotating means for rotating the shaft;

seed crystal pulling means for pulling the seed crystal by rate control and pulling of the shaft;

a support base rotatable with the shaft, movable in vertical direction in association with vertical movement of the shaft, having a through-hole to allow the constricted portion to pass and a slit for communicating the through-hole with outer peripheral portion to guide the constricted portion toward the through-hole in order to support lower end of the constricted portion formed under a portion with larger diameter under the seed crystal by pulling of the seed crystal pulling means and/or the portion with larger diameter of the single crystal;

crystal holding position control means for controlling position in vertical direction of the support base with respect to the position in vertical direction of the shaft, and when it is out of vertical position control operation, the support base is moved in vertical direction integrally with the shaft by transmitting motive power of the seed crystal pulling means; and support base moving means for moving the support base between a first position not to support the lower end of the constricted portion and/or the portion with larger diameter and a second position to support the lower end of the constricted portion and/or the portion with larger diameter, whereby:

driving mechanisms of each of the means are positioned outside the vacuum chamber for storing the crucible and the single crystal to be grown.

To attain the above object, according to the present invention, position of the gripping members to be engaged with lateral sides of the portion with larger diameter formed under the seed crystal is controlled in vertical direction with respect to the seed crystal holder, and when it is out of the vertical position control operation, the gripping members are moved integrally with the seed crystal holder in vertical direction by transmitting motive power of the seed crystal pulling means, and all driving mechanisms are arranged outside the vacuum chamber for storing the crucible and the single crystal to be grown.

Specifically, the present invention provides a single crystal pulling apparatus, which comprises:

rotating means for rotating a seed crystal holder to support a seed crystal above a crucible capable to hold a melted crystal;

seed crystal pulling means for pulling the seed crystal by rate control and pulling of the seed crystal holder;

gripping members rotatable with the seed crystal holder, movable in vertical direction in association with vertical movement of the seed crystal holder, and having tips for gripping lateral sides of the portion with larger diameter having a constant diameter formed above body portion under the seed crystal and by pulling of the seed crystal pulling means;

crystal holding position control means for controlling the position in vertical direction of the gripping members with respect to the single crystal holder, and when it is out of vertical position control operation, the gripping members are integrally moved in vertical direction with the seed crystal holder by transmitting motive power of the seed crystal pulling means; and gripping member opening and closing means for opening and closing tips of the gripping members, and tips of the gripping members are moved to lateral sides of the portion with larger diameter so that lateral sides of the portion with larger diameter are gripped when tips of the gripping members are closed, whereby:

driving mechanisms of each of the means are positioned outside the vacuum chamber for storing the crucible and the single crystal to be grown.

Further, the present invention provides a single crystal pulling apparatus, which comprises:

a shaft connected to a seed crystal holder for supporting a seed crystal above a crucible capable to hold a melted crystal;

rotating means for rotating the shaft;

seed crystal pulling means for pulling the seed crystal by rate control and pulling of the shaft;

gripping members rotatable with the shaft, movable in vertical direction in association with vertical movement of the shaft, and having tips thereof opened or closed to grip lateral sides of a portion with larger diameter having a constant diameter formed above a body portion under the seed crystal by pulling of the seed crystal pulling means;

crystal holding position control means for controlling position in vertical direction of the gripping members with respect to the shaft, and when it is out of the vertical position control operation, the gripping members are integrally moved with the shaft in vertical direction by transmitting motive power of the seed crystal pulling means; and gripping member opening and closing means for opening or closing tips of the gripping members, and tips of the gripping members are moved to lateral sides of the portion with larger diameter to grip lateral sides of the portion with larger diameter when tips of the gripping members are closed, whereby:

driving mechanisms of each of the means are positioned outside the vacuum chamber for storing the crucible and the single crystal to be grown.

BRIEF DESCRIPTION OF THE DRAWINGS

The objects and the features of the present invention as described above will become more apparent by the description on embodiments given in connection with the drawings attached herewith.

BEST MODE FOR CARRYING OUT THE INVENTION

Figure 1:
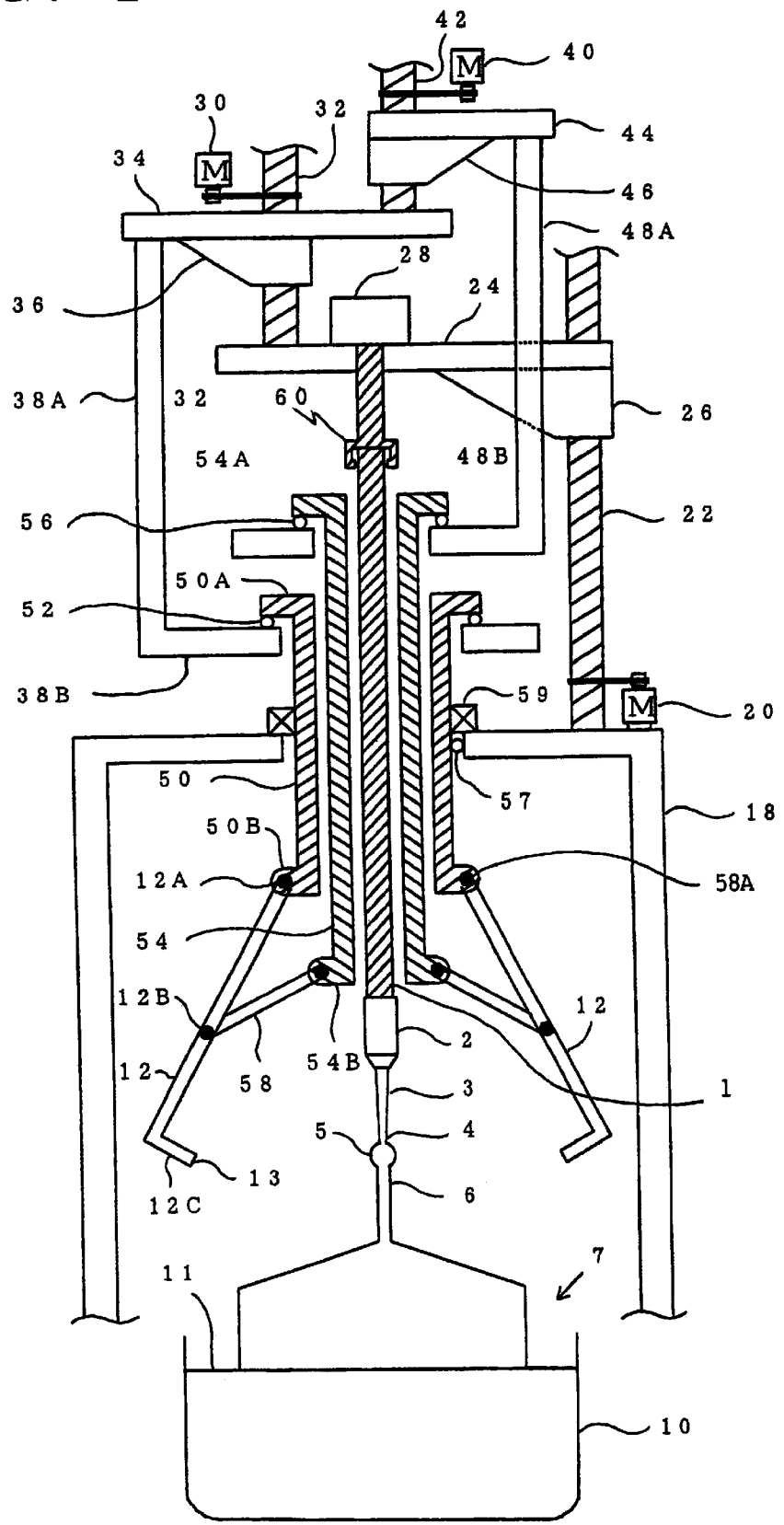
FIG. 1 is a partial cross-sectional view for schematically showing a first embodiment of a single crystal pulling apparatus according to the present invention.

In the following, description will be given on embodiments of the present invention referring to the attached drawings. FIG. 1 is a drawing to explain an embodiment of a single crystal pulling apparatus according to the present invention and a pulling process of the apparatus. In FIG. 1, a seed crystal holder 2 is attached on tip of a pulling shaft 1, and a seed crystal 3 is mounted on the seed crystal holder 2. The shaft 1 is a stationary member and it can be rotated by a motor 28 mounted on a first structure unit 24, which can be moved up or down with respect to a mechanical chamber 18, i.e. a vacuum chamber for accommodating a single crystal 7 to be grown and a quartz crucible 10. The first structure unit 24 has a screw unit 26 (nut unit) with internal thread, and this screw unit 26 is engaged with a rod 22 with external thread, which is rotated by a first motor 20 mounted on the mechanical chamber 18. Therefore, by the rotation of the first motor 20, the first structure unit 24 and the motor 28 mounted on it and the shaft 1 can be moved up and down with respect to the quartz crucible 10.

A shock absorber 60 serving as a crystal weight moving mechanism is arranged along the shaft 1 at the middle so that upward or downward rotation of the shaft can be transmitted. The details of the shock absorber 60 will be described later. The lower end of a rod 32 with external thread is fixed on the first structure unit 24, and the rod 32 with external thread is engaged with a screw unit 36, which is mounted on a second structure unit 34 and has internal thread. The rod 32 with external thread can be rotated by a second motor 30 mounted on the second structure unit 34. By this rotation, the second structure unit 34 can be moved up or down with respect to the first structure unit 24. Further, on the second structure unit 34, the lower end of a rod 42 with external thread is fixed, and the rod 42 with external thread is engaged with a screw unit 46, which is mounted on a third structure unit 44 and has internal thread. The rod 42 with external thread can be rotated by a third motor 40, which is mounted on the second structure unit 44. By this rotation, the third structure unit 44 can be moved up or down with respect to the second structure unit 34.

The second structure unit 34 comprises an extension member 38A extending downward and a plane member 38B arranged at the lower end of the extension member and extending in horizontal direction. It has a circular hole at the center. These are moved up or down integrally with the second structure unit 34. The third structure unit 44 comprises an extension member 48A extending downward and a plane member 48B arranged at the lower end of the extension member 48A and extending in horizontal direction. It has a circular hole at the center. These are moved up or down integrally with the third structure unit 44. Into the central holes of the plane members 38B and 48B, coaxial cylinders 50 and 54 coaxially formed on outer periphery of the shaft 1 are inserted respectively. An upper flange 50A of the cylinder 50 is rotatably arranged on upper surface of the plane member 38B via a ball bearing 52. On the other hand, an upper flange 54A of the cylinder 54 is rotatably arranged on upper surface of the plane member 48B via a ball bearing 56. Outer peripheral portion of the cylinder 50 can be rotated via a ball bearing 57 with respect to the central hole provided at the upper end of the mechanical chamber 18, and inner space of the mechanical chamber 18 is maintained in vacuum condition or filled with inert gas airtightly using a sealing member 59. Also, the space between the shaft 1 and the cylinder 54 and the space between the cylinder 54 and the cylinder 50 are maintained airtightly by sealing members (not shown).

On a lower flange 50B of the cylinder 50, the upper end of a gripping arm 12 is rotatably mounted via a pivot 12A. The lower end of the gripping arm 12 is designed in L-shape, and a pawl 13 to grip a portion with larger diameter 5 is provided at its forward end. In the figure, two gripping arms are shown, while 3 gripping arms may be provided if necessary. Using the pawl 13, the lower end of the portion with larger diameter 5 can be gripped by enclosing and squeezing it. In case it is designed in such manner that the forward end of the pawl 13 is spread out and the portion with larger diameter 5 is gripped from both sides, two arms 12 and two pawls 13 can perfectly fulfill the function. On a lower flange 54B of the cylinder 54, the upper end of a link member 58 is rotatably mounted via a pivot 58A. The lower end of the link member 58 is rotatably mounted on the gripping arm 12 at a position slightly above the center via a pivot 12B. All mechanisms and members arranged on upper portion of the mechanical chamber 18 are arranged outside the vacuum chamber, and this makes it possible to minimize the influence of dust or particles generated by motion of moving parts into the vacuum chamber (mechanical chamber) 18.

Figure 2:
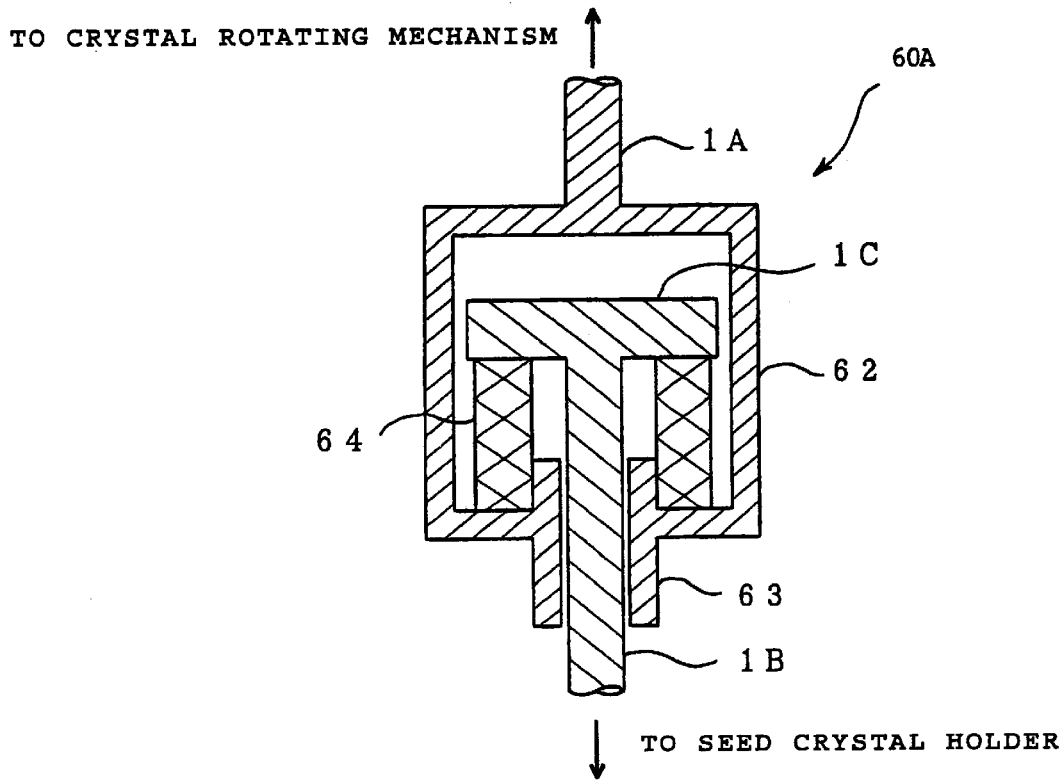
FIG. 2 is a cross-sectional view of an example of a shock absorber provided on a pulling shaft shown in FIG. 1.
Figure 3:
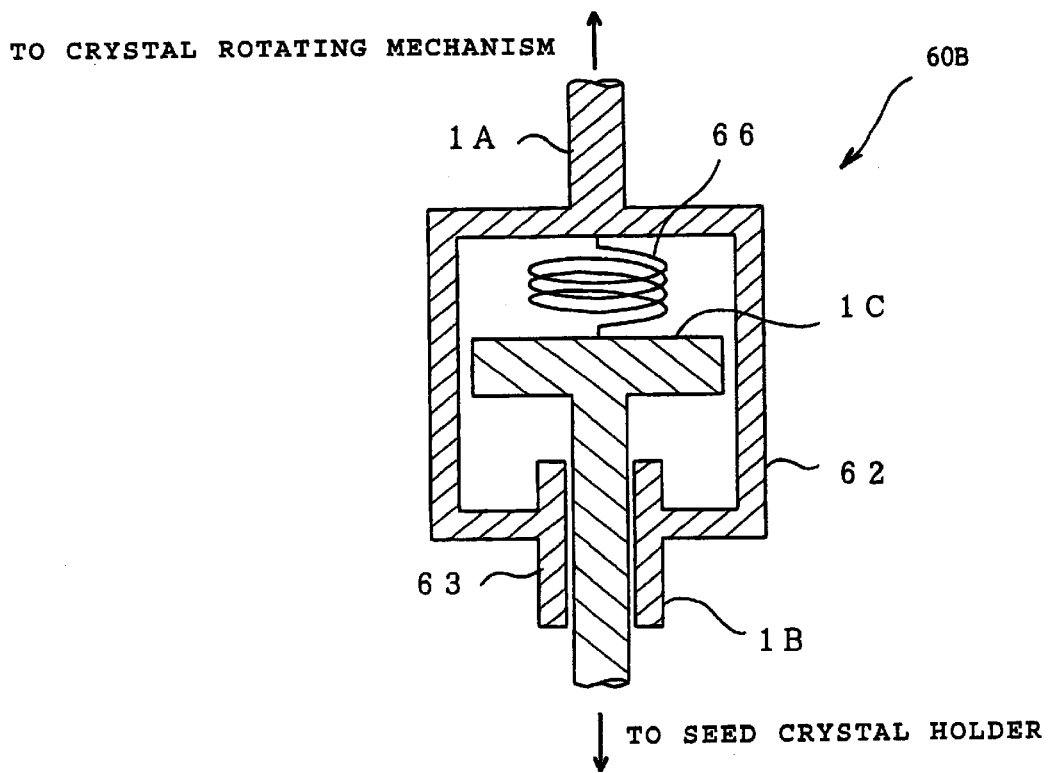
FIG. 3 is a cross-sectional view of another example of the shock absorber provided on the pulling shaft shown in FIG. 1.
Figure 4:
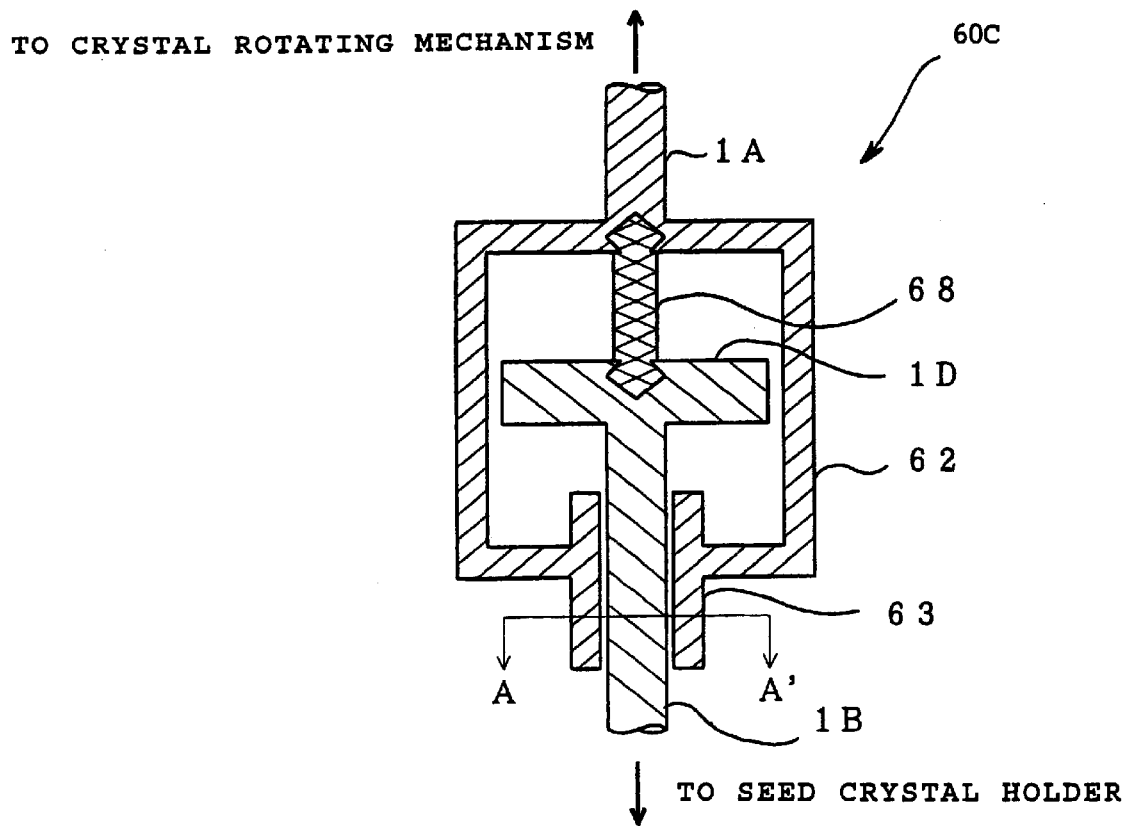
FIG. 4 is a cross-sectional view of still another example of the shock absorber provided on the pulling shaft shown in FIG. 1.
Figure 5:
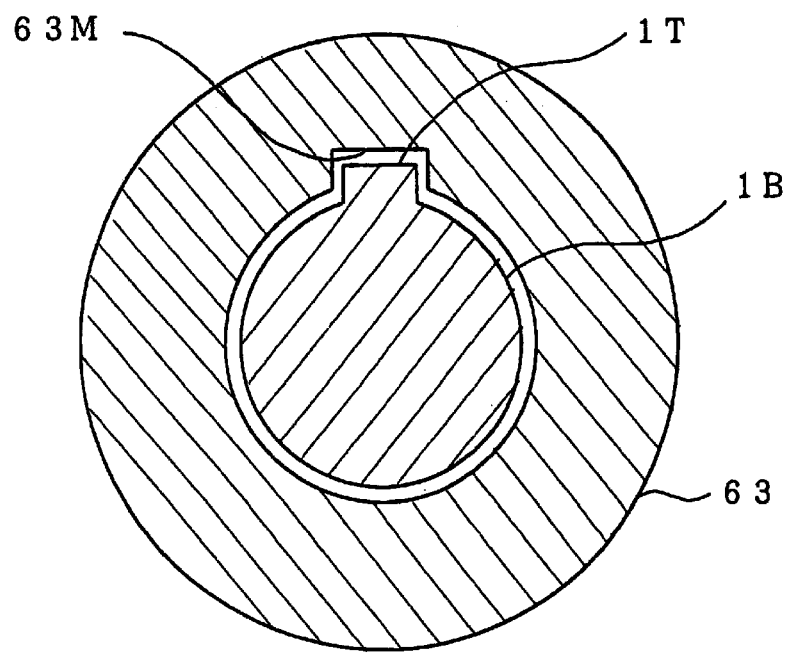
FIG. 5 is a cross-sectional view along the line A–A' in FIG. 4.

Now, description will be given on the details of the shock absorber 60 provided along the shaft 1 referring to FIG. 2 to FIG. 5. FIG. 2, FIG. 3 and FIG. 4 each represents a different embodiment of the shock absorber 60, and these are referred by symbols 60A, 60B and 60C respectively. As the arrangement common to FIG. 2 to FIG. 4, the upper portion of the shaft 1 shown in FIG. 1 is referred by reference symbol 1A, and the lower portion is referred by 1B. At the lower end of the upper portion 1A of the shaft 1, a box unit 62 with an opening at the lower end is provided. On the upper end of the lower portion 1B of the shaft 1, a T-shaped flange 1C (1D in FIG.4) is arranged, and the flange 1C is held inside the box unit 62. In the arrangement shown in FIG. 2, a compression rubber block 64 serving as elastic member is disposed between the lower end of the flange 1A and the inner bottom of the box unit 62. In the arrangement shown in FIG. 3, a tension spring (coil spring) 66 serving as elastic member is disposed between the upper end of the flange 1C and the upper inner surface of the box unit 62. In the arrangement shown in FIG. 4, a tension rubber block 68 serving as elastic member and having its both ends buried into the flange 1D and into upper inner wall of the box unit 62 is disposed. FIG. 5 is a cross-sectional view along the line A–A' of FIG. 4, and the same applies to FIG. 2 and FIG. 3. As shown in FIG. 5, a projection 1T disposed in axial direction on a part of outer periphery of the lower portion 1B of the shaft 1 is engaged in a groove 63M formed on a cylinder unit 63, which defines the lower opening of the box unit 62, and rotation force is transmitted. As a result, the upper portion 1A of the shaft 1 is synchronously rotated with the lower portion 1B regardless of whether the shock absorber 60 (60A, 60B or 60C) is present or not.

Next, description will be given on operation of the single crystal pulling apparatus of FIG. 1. When the single crystal main portion 7 is produced, the pressure in the mechanical chamber 18 is reduced to the level of about 10 torr, and fresh argon (Ar) gas is sent into it. At the same time, polycrystal in the quartz crucible 10 placed in the lower portion of the mechanical chamber 8 is heated and melted. When the preparation for pulling operation is completed, the first motor 20 is driven at first to move the first structure unit 24 down. Thus, the shaft is pulled downward in the figure and the seed crystal 3 is immersed into the surface of Si melt 11 in the quartz crucible 10 and is adapted to it. In this case, the arm 12 stands by at such a position that its tip does not come into contact with the Si melt 11 and the tip of the gripping arm 12 is opened so that it does not come into contact with the portion with larger diameter 5, which is being pulled (the condition shown in FIG. 1).

Next, after a predetermined time has elapsed, the first motor 20 is rotated in reverse direction to move the first structure unit 24 up. By pulling up the seed crystal 3 at relatively high rate, a neck portion 4 with diameter of 3–4 mm is formed. Then, the pulling rate is relatively slowed down to form the portion with larger diameter 5 for supporting the crystal under the neck portion 4, and the pulling rate is then relatively increased to form a constricted portion 6 under the portion with larger diameter 5. Next, the formation of the crystal main portion 7 is started.

Two or more of gripping arms 12 for gripping the constricted portion 6 under the portion with larger diameter 5 and the link mechanisms 58 for transmitting motive power to open or close the arms are rotated with the portion with larger diameter 5 by the rotation of the two cylinders 50 and 54. Each of the gripping arms 12 is designed in such manner that its tip can be opened or closed to grip the constricted portion 6 and can be moved up or down by the second structure unit to pull up the constricted portion 6 in gripped state. Also, the link mechanisms 58 for opening or closing the gripping arms 12 and the cylinders 54 connected thereto can be moved up or down by the third structure unit 44. By connecting a detection circuit comprising the cylinder 50, the arms 12, the pawls 13, and the single crystal, for example, the pawl at the tip of each gripping arm can detect that the pawl 13 has come into contact with the portion with larger diameter 5, which is being pulled up. A weight load detecting sensor for detecting loading of the weight of the portion with larger diameter 5 applied on the pawl 13 may be mounted on the cylinder 50. Through the detection by the detection circuit and the sensor as described above, it is possible to control the second motor to move the second structure unit up or down and to control the rate to pull up the arms 12.

When the portion with larger diameter 5 is moved up to a predetermined height during the pulling operation, the second motor 30 is operated to move the second structure unit 34 down so that the tip of each gripping arm 12 is positioned under the portion with larger diameter 5, and the second motor 30 is stopped at a predetermined position. Then, the third motor 40 is operated to close the pawl 13 at the tip of the gripping arm 12, and the third structure unit 44 is moved up. As a result, the pawl 13 at the tip of the gripping arm 12 enters under the portion with larger diameter 5. Under this condition, the third motor 40 is stopped. Then, the second motor 30 is operated to slightly move up the arm 12 which is in closed state. When the pawl 13 comes into contact with the constricted portion 6 or with the lower end of the portion with larger diameter 5, the second motor 30 is immediately stopped. Under this condition, the pawl 13 grips the portion with larger diameter 5. At this stage, it is necessary to move single crystal load after gripping in smooth and soft manner so that the crystal main portion 7 may not be turned to polycrystal due to vibration caused by the gripping. In the embodiment shown in FIG. 1, the shock absorber 60 is provided on the shaft 1, and the load can be moved without shock since the shock absorber 60 extends when the load exceeds a predetermined load is provided on a part of the shaft 1.

In the gripping operation to grip the portion with larger diameter 5, the second motor 30 is rotated to move the cylinder 50 up. When the gripping arm 12 is slightly moved up, the gripping arm 12 is moved up together with the second structure unit 34, i.e. together with the first structure unit 24 and the pulling shaft 1, and the moving rate is increased to higher than the ascending speed of the pulling shaft 1. When the pawl 13 of the gripping arm 12 grips the portion with larger diameter 5, the second motor 30 is stopped, and the second structure unit 34 is fixed with respect to the first structure unit 24. Prior to this operation, the third motor 40 is operated so that the pawl 13 is positioned under the portion with larger diameter 5. Then, the third motor 40 is stopped, and the third structure unit 44 is fixed with respect to the second structure unit 34. Under this condition, the first structure unit 24, the second structure unit 34 and the third structure unit 44 are all integrally moved up merely by the driving of the first motor 20. Therefore, the seed crystal 2 and the pawl 13 are moved up at exactly the same rate.

In the above embodiment, the detection circuit or the sensor is disposed on the cylinder 50 connected with the gripping arm or the portion including the pawl 13, while these may be provided on the shaft 1, which serves as the seed crystal lifting mechanism. Further, an optical sensor, i.e. a non-contact type sensor or a device having image pickup device combined with image processing system, may be used to detect that the pawl 13 of the gripping arm 12 is at a position to contact the portion with larger diameter 5, and the timing to drive the gripping arm 12 may be determined accordingly.

Figure 6:
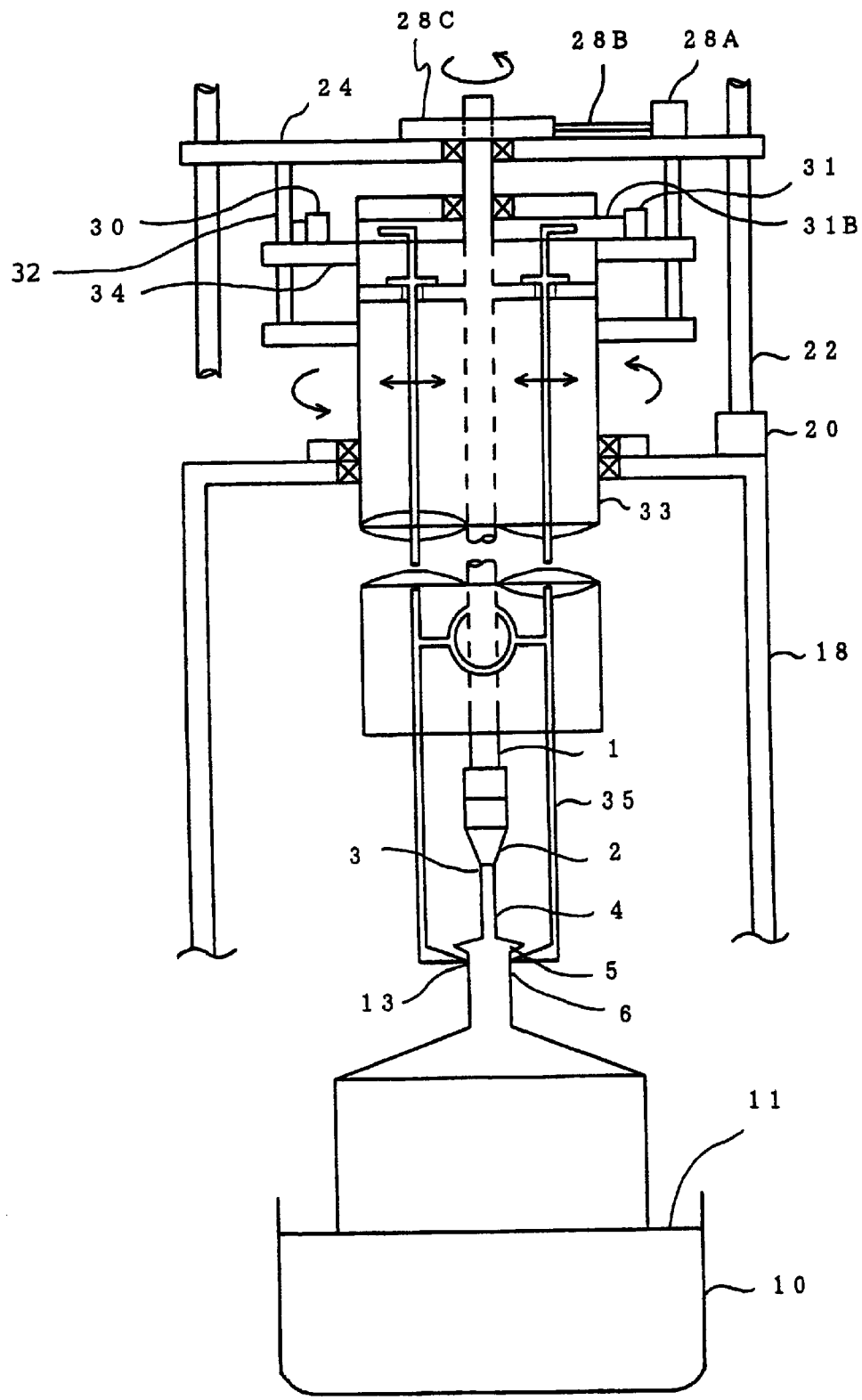
FIG. 6 is a partial cross-sectional view for schematically showing a second embodiment of a single crystal pulling apparatus according to the present invention.

Next, description will be given on a second embodiment of the single crystal pulling apparatus of the present invention referring to FIG. 6. The second embodiment is a variation of the first embodiment, and it is different from the first embodiment in the arrangement of the arm for gripping the portion with larger diameter of the single crystal and also in the arrangement of the mechanism to open or close the arm. Also, it is different from the first embodiment in the mechanism for rotating the shaft 1 and the mechanism for rotating the arm. Description will be concentrated here on these different features. The motor 20 is arranged on the mechanical chamber 18, and the rod 22 with thread is rotated to move the first structure unit 24, and this is the same as in the first embodiment. The pulling shaft 1 is rotatably mounted on the first structure unit 24, and motive power of a motor 28A is transmitted to a pulley 28C via a belt 28B to rotate the shaft 1. A rod 32 with thread extending downward is rotatably supported on the first structure unit 24. When it is rotated by a motor 30 mounted on the second structure unit 34, the second structure unit 34 is moved up or down with respect to the first structure unit 24 as in the first embodiment. On the second structure unit 34, a cylinder 33 is rotatably mounted. When motive power from a motor 31 mounted on the second structure unit is transmitted via a belt 31B, the cylinder 33 is rotated. The motors 28A and 31 are controlled by a synchronization controller (not shown), and the shaft 1 is synchronously rotated with the cylinder 33.

Inside the cylinder 33, a plurality of gripping arms 35 movable in radial direction with respect to the shaft 1 are held. The gripping arms 33 correspond to the gripping arms 12 in the first embodiment. When a pawl 13 at the lower tip of each of the gripping arms is closed, the portion with larger diameter 5 is gripped. In FIG. 6, two gripping arms 35 are shown, while the arms may be increased, and the pawl may be widened as in the first embodiment. The gripping arms 35 are opened or closed by supplying pressure gas or pressure fluid into air cylinder or hydraulic cylinder serving as a driving mechanism (not shown) above the gripping arm.

Next, description will be given on a third embodiment of the single crystal pulling apparatus of the present invention referring to FIG. 7. The third embodiment is a variation of the first embodiment, and it is different from the first embodiment in the arrangement to hold the portion with larger diameter 5 of the single crystal. Description will be concentrated here on these different features. A motor 20 is placed on a mechanical chamber 18, and a first structure unit 24 is moved up or down by rotating a rod 22 with thread, and this is the same as in the first embodiment. A pulling shaft 1 is rotatably mounted on the first structure unit 24, and the shaft 1 is rotated by the motor 28 placed on the first structure unit 24. Under the first structure unit 24, the shaft 1 is fixed, and a rotating baseplate 34A rotated with the shaft 1 is provided. The rotating baseplate 34A may be regarded as corresponding to the second structure unit 34 in the first embodiment, while it is different from the first embodiment in that its vertical position is always constant with respect to the first structure unit 24.

A motor 30 is mounted on the rotating baseplate 34A, and the rod 32 with thread is rotated. The rod 32 with thread can be moved up or down with respect to the rotating baseplate 34A and it is engaged with female screw unit 36, which is rotatably held on a support member shaft 72. Therefore, when the motor 30 mounted on the rotating baseplate 34A is rotated, the support member shaft 72 is moved up or down with respect to the rotating baseplate 34A and the first structure unit 24.

The support member shaft 72 is extending inside the mechanical chamber 18 via a rotary table 80, which is rotatably mounted on the upper portion of the mechanical chamber 18 via a bearing 82, and a dish-like support member 70 is mounted on the lower end of the support member shaft. FIG. 8 is a cross-sectional view along the line B–B' in FIG. 7. As shown in FIG. 8, the support member 70 is provided with a through-hole 73 at its center, and the through-hole 73 is communicated with outer periphery via a penetrating slit 74. The support member shaft 72 can be rotated at an angle of about 90 degrees by a motor 40 mounted on a motor support 41. Accordingly, the support member 70 can rotate and move from a non-holding position shown by solid lines in FIG. 8 to a holding position shown by dotted lines. The slit 74 is designed to have a diameter larger than the diameter of the single crystal under the portion with larger diameter 5, and the support member 70 enters under the portion with larger diameter 5 via the slit 74.

Figure 7:
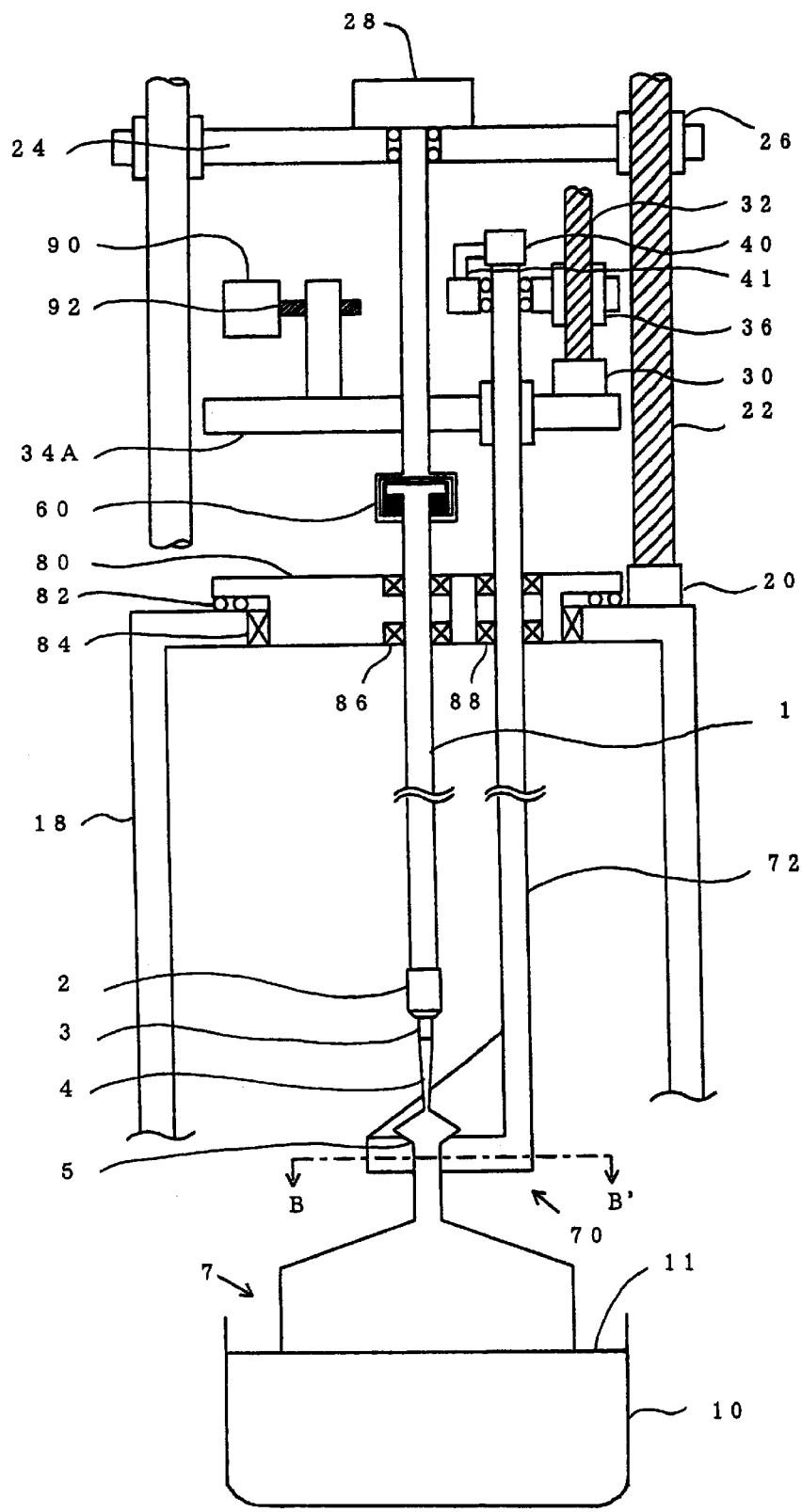
FIG. 7 is a partial cross-sectional view for schematically showing a third embodiment of a single crystal pulling apparatus according to the present invention.
Figure 8:
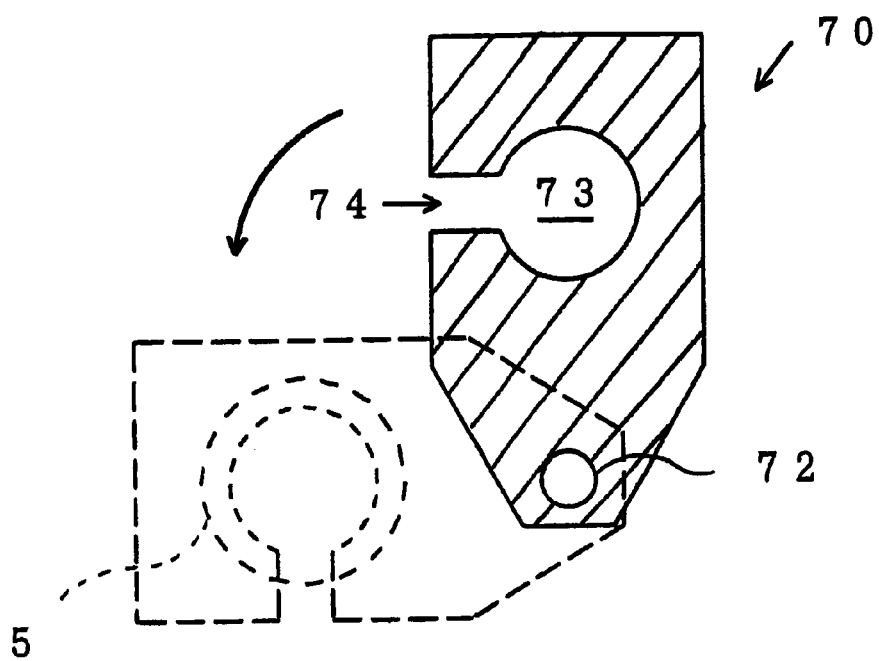
FIG. 8 is a cross-sectional view along the line B–B' in FIG. 7 showing the aspects of rotary movement by solid lines and dotted lines.

In FIG. 7, a balance weight 90 is provided together with an adjusting screw 92 on the rotating baseplate 34A. Also, sealing members 84, 86, and 88 are arranged on the rotary table 80. On the pulling shaft 1, a shock absorber 60 is provided as in the first embodiment.

The third embodiment shown in FIG. 7 is operated as follows: Similarly to the first embodiment, when the preparation for pulling operation is completed, the first motor 20 is operated at first to move the first structure unit 24 down. Thus, the shaft 1 is pulled downward in the figure, and the seed crystal 3 is immersed into the surface of the Si melt 11 in the quartz crucible 10 and is adapted to it. In this case, the support member 70 stands by at such a position as not to be in contact with the Si melt 11, and the support member 70 is at the non-holding position shown by solid lines in FIG. 8 so that it does not come into contact with the portion with larger diameter 5, which is being pulled up.

Next, after a predetermined time has elapsed, the first motor 20 is rotated in reverse direction to move the first structure unit 24 up. By pulling up the seed crystal 3 at relatively high rate, a neck portion 4 with diameter of 3–4 mm is formed under the seed crystal 3. Then, the pulling rate is relatively slowed down, and a portion with larger diameter 5 for support is formed under the neck portion 4. Then, the pulling rate is relatively increased to form a constricted portion 6 under the portion with larger diameter 5, and the formation of the crystal main portion 7 is started.

Next, the motor 30 is rotated, and the support member 70 is brought to a height positioned under the portion with larger diameter 5. Then, the motor 40 is rotated, and the support member shaft 72 is rotated up to the position shown by dotted lines in FIG. 8 so that the support member 70 is positioned immediately under the portion with larger diameter 5. Then, the motor 30 is rotated further to move the support member 70 up at a rate higher than the ascending rate of the pulling shaft 1. When the support member 70 supports the lower end of the portion with larger diameter 5, the motor 30 is stopped. Thereafter, the first structure unit 24 and the rotating baseplate 34A are integrally moved up by the motor 20. Thus, the seed crystal 3 and the support member 70 are moved up at exactly the same rate.

Next, description will be given on a fourth embodiment of the single crystal pulling apparatus of the present invention referring to FIG. 9. The fourth embodiment is a variation of the third embodiment, and it is different from the third embodiment in that the rotating baseplate 34A and the rotary table 80 are integrated and that a bellows chamber 18A expandable in vertical direction is used instead of the mechanical chamber 18. Description will be concentrated here on these different features. A motor 20 is placed on a stationary member (not shown), and a rod 22 with thread is rotated to move a first structure unit 24 up or down. This is approximately the same as in the first embodiment. However, the first structure unit 24 mainly comprises three members of 24A, 24B and 24C, and the L-shaped unit 24A having two screw units 26 is connected to a baseplate 24C via a plurality of fixing shafts 24B. The pulling shaft 1 is rotatably mounted on the baseplate 24C of the first structure unit 24, and the shaft 1 is rotated by the motor 28 placed on the baseplate 24C. Under the baseplate 24C, there is provided a rotary table 80 (simultaneously serving as the rotating baseplate 34A and the rotary table 80 in the third embodiment), which is integrally connected with the shaft 1 and rotated with the shaft 1. The rotary table 80 is always at constant level in vertical position with respect to the first structure unit 24.

The motor 30 is mounted on the rotary table 80 and the rod 32 with thread is rotated. The rod 32 with thread can be moved in vertical direction with respect to the rotary table 80 and it is engaged with a female screw unit 36, which is rotatably supported on the support member shaft 72. Therefore, when the motor 30 mounted on the rotary table 80 is rotated, the support member shaft 72 is moved up or down with respect to the rotary table 80 and the first structure unit 24. The rotary table 80 is rotatably mounted on the L-shaped member 24A of the first structure unit 24 via a bearing 82.

The support member shaft 72 is expending inside the bellows chamber 18A via the rotary table 80, and a dish-like support member 70 is mounted on its lower end. The support member 70 is designed in the same manner as in the third embodiment, and detailed description is not given here.

When the support member shaft 72 is rotated by the motor 40 as shown by an arrow in FIG. 8, the support member 70 can enter under the portion with larger diameter 5. In FIG. 9, a balance weight 90 is provided together with an adjusting screw 82 on the rotary table 80, and sealing members 84, 86 and 88 are arranged in the same manner as in the third embodiment. Also, the pulling shaft 1 is provided with a shock absorber 60 as in the first embodiment.

Figure 9:
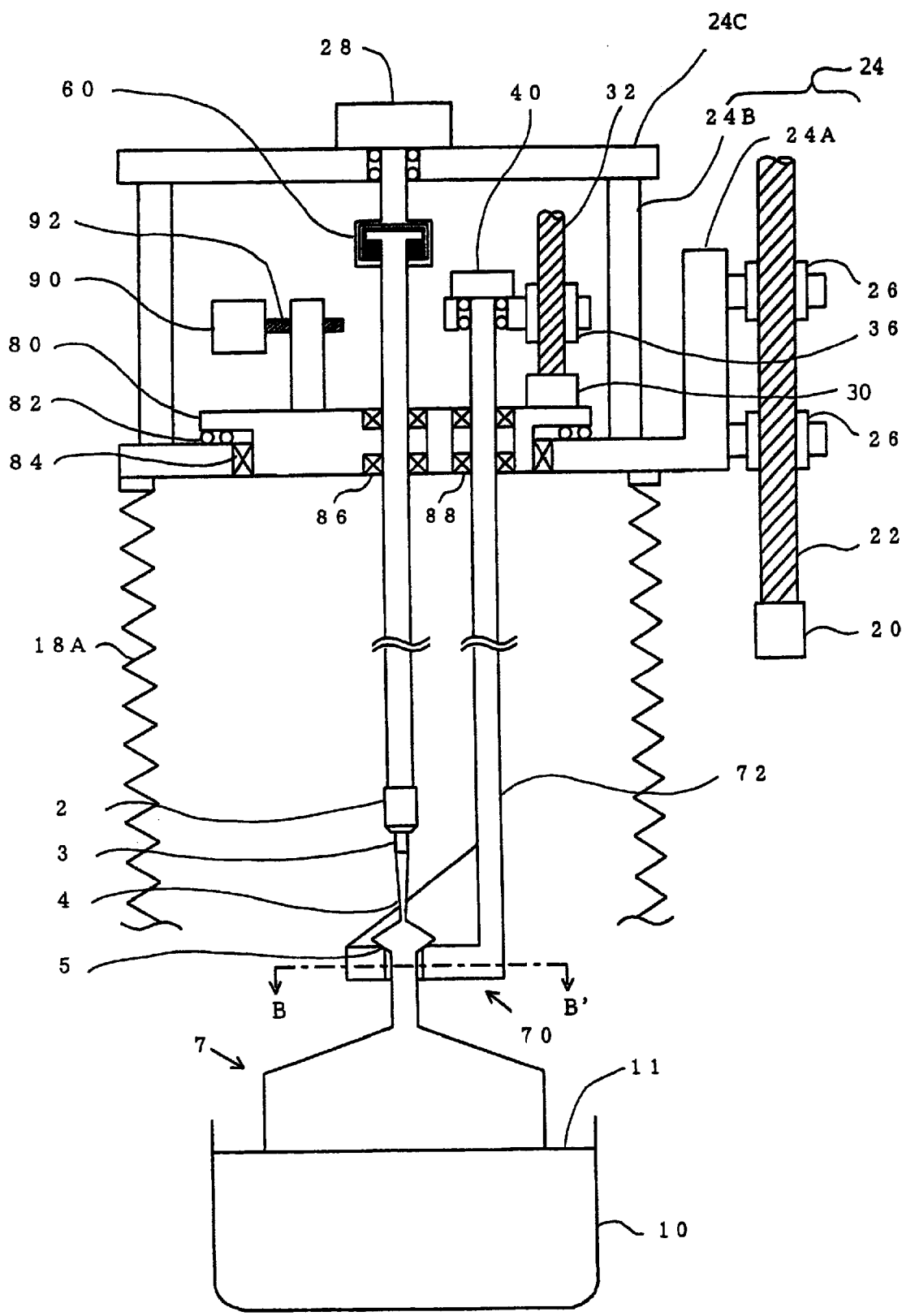
FIG. 9 is a partial cross-sectional view for schematically showing a fourth embodiment of a single crystal pulling apparatus of the present invention.

The fourth embodiment shown in FIG. 9 is operated as follows: Similarly to the third embodiment, when the preparation for the pulling operation is completed, the first motor 20 is operated at first, and the first structure unit 24 is moved down. Thus, the shaft 1 is moved down in the figure, and the seed crystal 3 is immersed into the surface of the Si melt 11 in the quartz crucible 10 and is adapted to it. In this case, the support member 70 stands by at a such position that its tip does not come into contact with the Si melt 11. The support member 70 is at a non-holding position shown by solid lines in FIG. 8 so that it does not come into contact with the portion with larger diameter 5, which is being pulled up.

Next, after a predetermined time has elapsed, the first motor 20 is rotated in reverse direction to move the first structure unit 24 up. By pulling up the seed crystal 3 at relatively high rate, a neck portion 4 with diameter of 3–4 mm is formed under the seed crystal 3. Then, the pulling rate is relatively slowed down, and a portion with larger diameter 5 for support is formed under the neck portion 4. Then, the pulling rate is relatively increased, and a constricted portion 6 is formed under the portion with larger diameter 5. Then, the formation of the crystal main portion 7 is started.

Next, the motor 30 is rotated, and the support member 70 is brought to a height under the portion with larger diameter 5. Thereafter, the motor 40 is rotated, and the support member shaft 72 is rotated up to the position shown by dotted lines in FIG. 8 so that the support member 70 is positioned immediately under the portion with larger diameter 5. Next, the motor 30 is rotated further to move the support member 70 up, and it is moved at a rate higher than the ascending rate of the pulling shaft 1. When the support member 70 holds the lower end of the portion with larger diameter 5, the motor 30 is stopped. Thereafter, the first structure unit 24 and the rotating baseplate 34A are integrally moved up by the motor 20 and the seed crystal 3 and the support member 70 are moved up at exactly the same rate. In the fourth embodiment, the bellows chamber 18A is used, and this serves simultaneously as the rotating baseplate 34A and the rotary table 80 in the third embodiment. Therefore, it is possible to lower the height of the entire single crystal pulling apparatus compared with the third embodiment.

Figure 10:
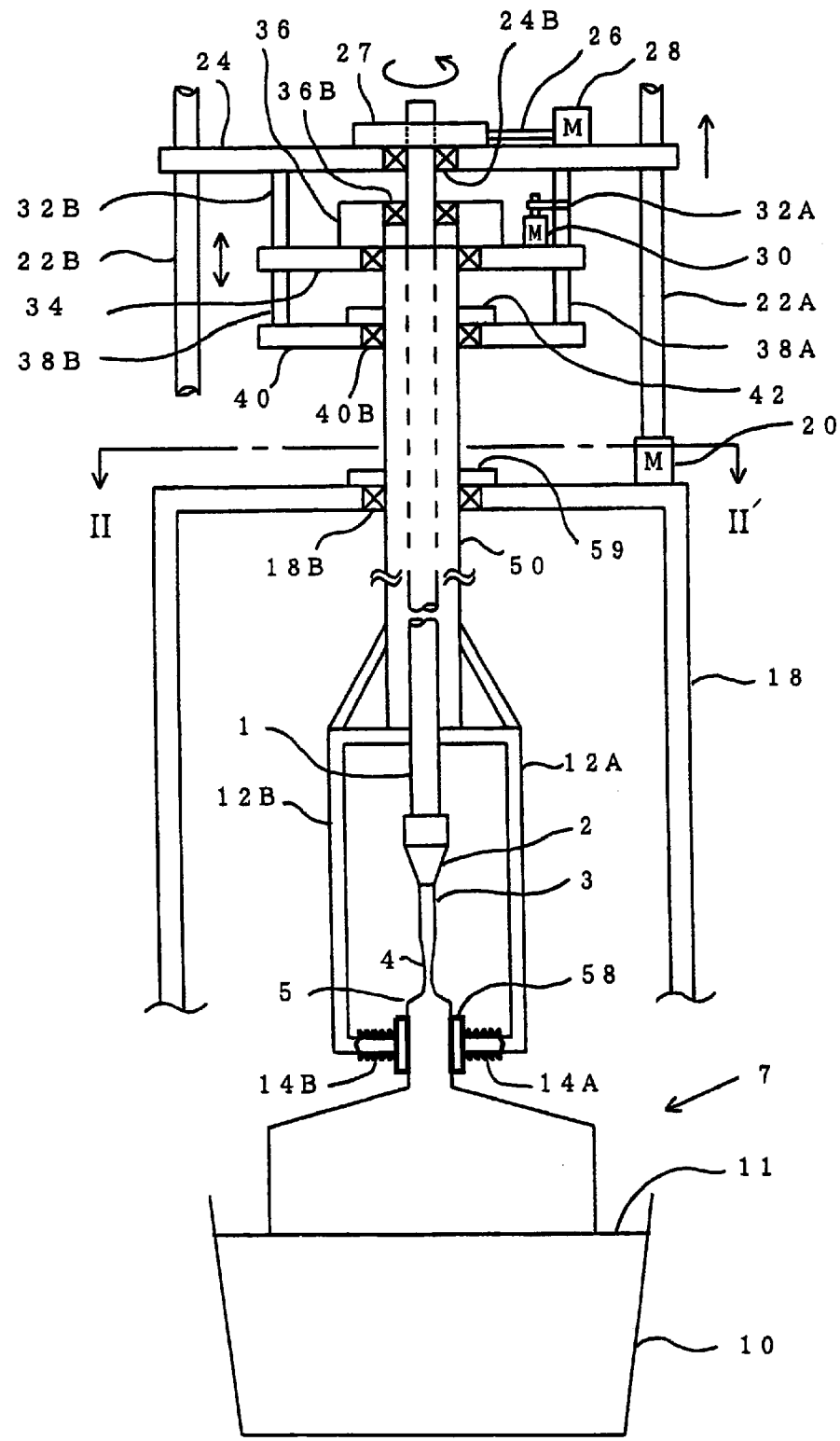
FIG. 10 is a partial cross-sectional view for schematically showing a fifth embodiment of a single crystal pulling apparatus of the present invention.

FIG. 10 shows a fifth embodiment of the single crystal pulling apparatus of the present invention and its pulling process. In FIG. 10, a seed crystal holder 2 is mounted at the tip of the pulling shaft 1, and the seed crystal 3 is mounted on the seed crystal holder 2. The pulling shaft 1 is arranged in such manner that it can be rotated by a motor 28 mounted on a disk-like first structure unit 24, which is movable in vertical direction with respect to a mechanical chamber. The mechanical chamber is a vacuum chamber to accommodate the single crystal 7 to be grown and the quartz crucible 10 and serves as a stationary member. That is, the motor 28 rotates the pulling shaft 1 via a pulley (not shown), a belt 26 and a pulley 27 mounted on the pulling shaft 1. This pulling shaft 1 performs the pulling operation to turn to the so-called dislocation-free condition, and it is also called a dislocation-free shaft. The first structure unit 24 comprises a screw unit (nut unit) (not shown) with internal thread, and the screw unit is engaged with a rod 22A with external thread rotated by the first motor 20 which is mounted on the mechanical chamber 18. Therefore, when the first motor 20 is rotated, the first structure unit 24, the motor 28 mounted on it and the shaft 1 can be moved up or down with respect to the quartz crucible 10. The pulling shaft 1 is rotatably supported with respect to the first structure unit 24 via a bearing 24B.

On the first structure unit 24, a rod 32A with external thread (ball screw) and upper end of a guide rod 32B are fixed. The rod 32A with external thread is engaged with a screw unit (not shown) with internal thread mounted on the disk-like second structure unit 34. The rod 32A with external thread can be rotated by the second motor 30 mounted on the second structure unit 24. By this rotation, the second structure unit 34 can be moved in vertical direction with respect to the first structure unit 24. Further, a compressed gas introducing unit 36 is provided on the second structure unit 34. The compressed gas introducing unit 36 is in contact with outer periphery of the pulling shaft 1 via a bearing 36B and receives the compressed gas supplied from a pump (not shown). Also, the second structure unit 34 is in contact with outer periphery of a cylinder 50 which is coaxially arranged around the pulling shaft 1 via a bearing 34B. The rod 32A with external thread and the guide rod 32B are extending downward from the second structure unit 34 respectively, and the lower end of each of these rods is fixed on the third structure unit 40. Also, the third structure unit 40 is in contact with outer periphery of the cylinder 50 via a bearing 40B. Therefore, the cylinder 50 can be rotated with respect to the first structure unit 34 and the third structure unit 40. On the third structure unit 40, an annular plate 42 to reinforce the third structure unit itself and to hold the bearing 40B is arranged.

Figure 11:
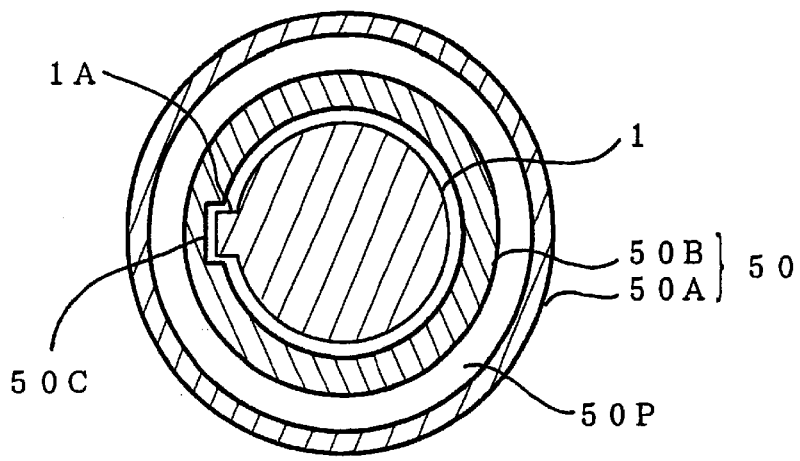
FIG. 11 is a cross-sectional view along the line II–II' in FIG. 10.

FIG. 11 is a cross-sectional view along the line II–II' in FIG. 10. A cylinder 50 has dual structure and is provided with an annular passage 50P to guide the compressed gas introduced from the compressed gas introducing unit 36. That is, the cylinder 50 comprises an inner cylinder 50B and an outer cylinder 50A, and these are designed coaxially with the pulling shaft 1. On outer periphery of the pulling shaft 1, a projection 1A extending in axial direction is disposed. On the other hand, on inner periphery of the inner cylinder 50B, a recess 50C to receive the projection 1A is formed. Thus, when the pulling shaft 1 is rotated, the cylinder 50 is synchronously rotated. From the lower end of the cylinder 50, the pulling shaft 1 is exposed. Also, near the lower end of the cylinder 50, two arms 12A and 12B extending downward are mounted. The cylinder 50 can be rotated with respect to the mechanical chamber 18 via a ball bearing 18B, and inner space of the mechanical chamber 18 is maintained in vacuum condition or filled with inert gas airtightly using a sealing member 59. Also, the space between the pulling shaft 1 and the cylinder 50 is maintained airtightly by a sealing member (not shown).

The lower end of each of the gripping arms 12A and 12B is designed in L-shape, and air cylinders 14A and 14B for gripping lateral sides of the portion with larger diameter 5 are mounted on its tip respectively. Two air cylinders 14A and 14B are shown in FIG. 10, while four air cylinders 14A to 14D may be provided in radial direction on a ring-like member 16, which is mounted on the lower ends of the gripping arms 12A and 12B. By arranging and fixing a plurality of air cylinders 14A to 14D in radial direction by the ring-like member 16, axis of a piston 52 of each of the air cylinders 14A to 14D is arranged in radial direction and also in horizontal direction (a direction perpendicular to the single crystal pulling direction). By the use of the ring-like member 16, reaction in horizontal direction by the piston 52 can be compensated.

Two gripping arms are shown in FIG. 10, while three arms may be provided if necessary. All mechanisms and members in the upper portion of the mechanical chamber 18 are outside the vacuum chamber, and this makes it possible to minimize the intermingling of dust or particles generated by movement of movable parts into inner space of the vacuum chamber (mechanical chamber) 18.

Figure 13:
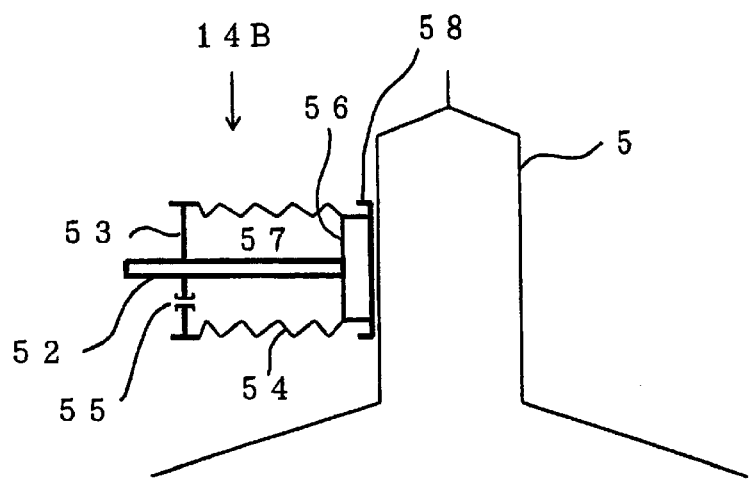
FIG. 13 is a cross-sectional view showing relationship between the air cylinder and a portion with larger diameter.

FIG. 13 is a cross-sectional view schematically showing the structure of an air cylinder 14B. The air cylinder 14B has a piston 52, which can be moved perpendicularly with respect to a fixed supporting unit 53. A head 56 is mounted at the tip of the piston 52. Outer edge of the holding unit and outer edge of the head 56 are connected by a bellows 54, and a piston chamber 57 is defined. The bellows 54 is in shrunk state because of its own shrinking force when no gas pressure is applied in the piston chamber 57. At the tip of the head 56, a contact member 58 is mounted, which can come into contact with the lateral side of the portion with larger diameter 5. On the fixed support member 53, there are provided an annular passage 50P of the cylinder and a communication hole 55, which guides the compressed gas supplied through inner space (not shown) of the gripping arms 12A and 12B into the piston chamber 57. A plurality of contact members 58 are opened or closed with respect to the portion with larger diameter 5, and the gripping arms 12A and 12B themselves do not move the portion with larger diameter 5 in radial direction.

Next, operation of the single crystal pulling apparatus of FIG. 10 will be described. When the single crystal main portion 7 is produced, the pressure in the mechanical chamber 18 is reduced to about 10 torr and fresh argon (Ar) gas is introduced. Polycrystal in the quartz crucible 10 placed under the mechanical chamber 18 is heated and melted. When the preparation for the pulling operation is completed, the first motor 20 is operated at first to move the first structure unit 24 down. Thus, the pulling shaft 1, i.e. dislocation-free shaft, is pulled downward in the figure, and the seed crystal 3 is immersed into the surface of the Si melt 11 in the quartz crucible 10 and is adapted to it. In this case, the gripping arms 12A and 12B are at standby position so that the air cylinders 14A to 14D at the tips do not come into contact with the Si melt 11, and the contact members 58 of the air cylinders 14A to 14D are opened so that these are not in contact with the portion with larger art diameter, which is being pulled up (closed condition is shown in FIG. 10). Next, after a predetermined time has elapsed, the first motor is rotated in reverse direction to move the first structure unit 24 up. By pulling up the seed crystal 3 at relatively high rate, a neck portion (Dash's neck) with diameter of 3–4 mm is formed under the seed crystal 3. Next, the pulling rate is relatively slowed down and a portion with larger diameter 5 for support is formed over a predetermined length under the neck portion 4. Then, the pulling rate is relatively slowed down, and the formation of the single crystal main portion 7 under the portion with larger diameter 5 is started.

When the compressed gas is supplied into the air cylinders 14A to 14D for gripping lateral sides of the portion with larger diameter 5 through the compressed gas introducing unit 36, the annular passage 50P of the cylinder 50, and a passage (not shown) in each of the gripping arms 12A and 12B, the contact members 58 grip lateral sides of the portion with larger diameter 5 from four radial directions. The contact members 58 grip the lateral sides of the portion with larger diameter 5 when the load of the single crystal 7 applied on the pulling shaft 1 reaches about 100 kg. When the gripping arms 12A and 12B are rotated by the cylinder 50, the air cylinders 14A to 14D are rotated together with the portion with larger diameter 5. The gripping arms 12A and 12B can be moved in vertical direction by the second structure unit 34 in order to pull up the portion with larger diameter 5 in gripped state.

Detailed description will be given now on the gripping of lateral sides of the portion with larger diameter 5 by the air cylinders 14A to 14D. When the portion with larger diameter 5 is moved up to a predetermined height by the pulling of the pulling shaft 1, the second motor 30 is operated to move down the second structure unit 34 so that the contact members 58 of the air cylinders 14A to 14D are positioned on lateral sides of the portion with larger diameter 5. At the predetermined position, the second motor 30 is stopped. Next, the compressed gas is supplied to the air cylinders 14A to 14D to grip the lateral sides of the portion with larger diameter 5. Then, the piston 52 is moved, and bellows 54 is extended, and the contact members 58 grip lateral sides of the portion with larger diameter from four radial directions. AS a result, the contact members 58 squeeze the lateral sides of the portion with larger diameter 5 from four directions. When gas pressure reaches a predetermined level, a valve (not shown) is closed, and pressurized state, i.e. gripping state, is maintained. Under this condition, the first motor 20 is operated, and the first structure unit 24 and the second structure unit 34 are integrally pulled up. Thus, the pulling shaft 1 is pulled up in synchronization with the contact members 58. At this stage, it is necessary to move the load of the single crystal after gripping in smooth and soft manner so that the crystal main portion 7 is not turned to polycrystal due to vibration caused by gripping. It is preferable to provide a shock absorber (not shown), comprising spring and the like, on the shaft 1 in the middle, because the load can be moved without being accompanied by shock.

As it is evident from the above description, when the portion with larger diameter 5 is gripped by driving of the air cylinders 14A to 14D, the second motor 30 is stopped, and the second structure unit 34 is fixed with respect to the first structure unit 24. Under this condition, the first structure unit 24 and the second structure unit 34 are integrally moved up merely by the driving of the first motor 20. Therefore, the seed crystal 3 and the contact members 58 are moved up at exactly the same rate. The rate or the speed of the first motor can be automatically controlled based on the results of the observation on diameter of the single crystal 7 to be grown or on the results of temperature measurement of the melt 11. In other words, in the present embodiment, the pulling shaft, i.e. the dislocation-free shaft, and members to grip the portion with larger diameter 5, e.g. the cylinder 50 and the contact members 58, etc., are integrally pulled up by a single driving source, i.e. the first motor 20. As a result, the pulling rate can be controlled only on the dislocation-free shaft. This means simple control, and dislocation-free state can be achieved by moving self-weight of the single crystal. The same applies to the subsequent embodiments described herein. During power suspension, for example, gas pressure is decreased and gripping force on the portion with larger diameter 5 may be weakened, and this may lead to accident such as dropping of the single crystal. Therefore, it is preferable that a valve is provided on the passage of the compressed gas, and that in the pressurized state, i.e. when the piston 52 in FIG. 13 closes the contact members 58, the valve is automatically closed and gripping force higher than a predetermined value is maintained.

Figure 14:
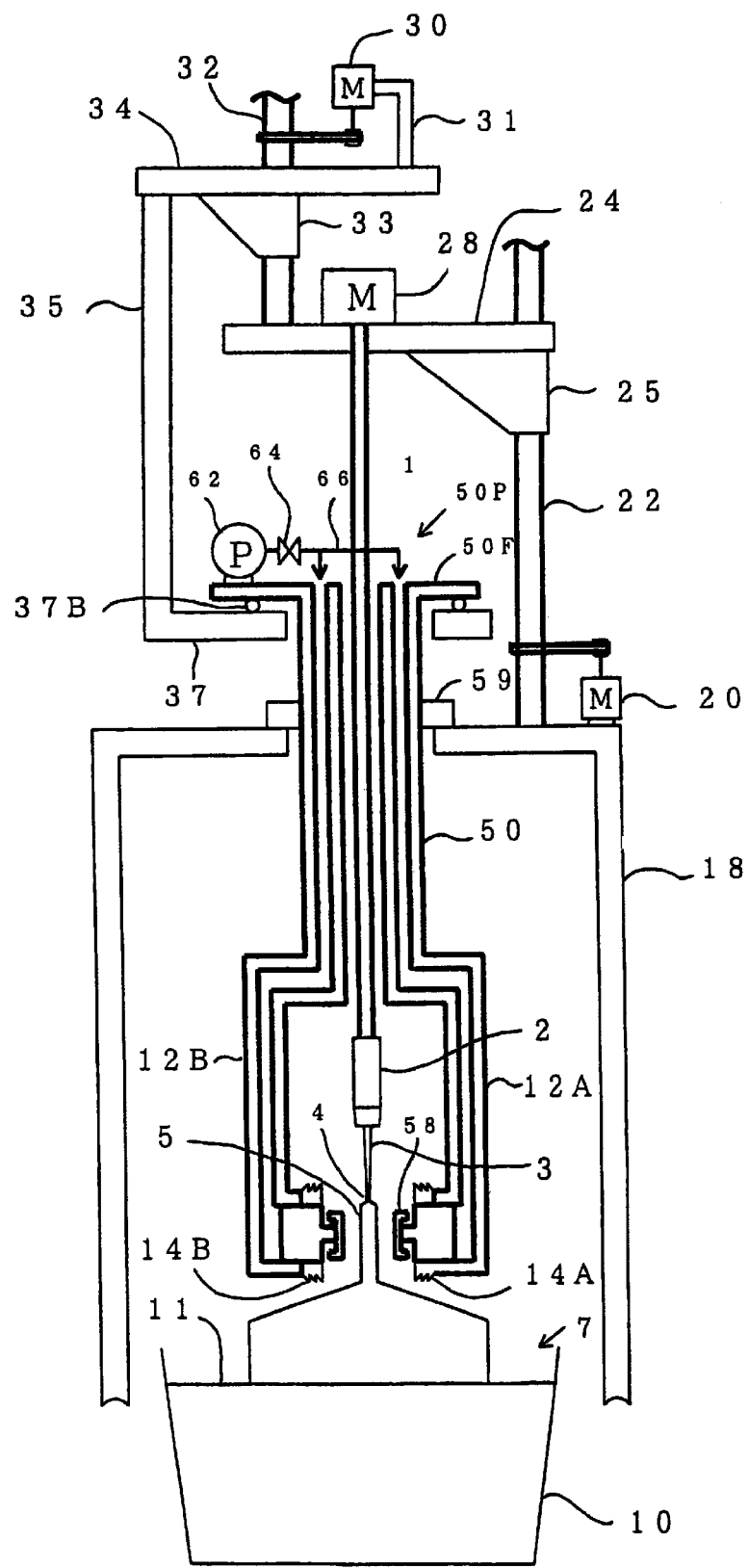
FIG. 14 is a partial cross-sectional view for schematically showing a sixth embodiment of a single crystal pulling apparatus of the present invention.

Next, description will be given on a sixth embodiment of the single crystal pulling apparatus of the present invention referring to FIG. 14. The sixth embodiment is a variation of the fifth embodiment. In FIG. 14, a seed crystal holder 2 is mounted at the tip of the pulling shaft 1, and the seed crystal 3 is mounted on the seed crystal holder 2. These features are the same as in the fifth embodiment. The shaft 1 can be rotated by a motor 28 mounted on the first structure unit 24, which is movable up or down with respect to the mechanical chamber 18, serving as a stationary member. The first structure unit 24 has a screw unit (nut unit) with internal thread, and this screw unit is engaged with a rod 22 with external thread, which is rotated by the first motor 20 mounted on the mechanical chamber 18. Therefore, by the rotation of the first motor 20, the first structure unit 24 and the motor 28 mounted on it and the shaft 1 can be moved up or down with respect to the quartz crucible 10.

The lower end of the rod 32 with external thread is fixed on the first structure unit 24, and the rod 32 with external thread is engaged with the screw unit 33 with internal thread mounted on the second structure unit 34. The rod 32 with external thread can be rotated by the second motor 30, which is mounted on the second structure unit 34 by a mounting member 31. By this rotation, the second structure unit 34 can be moved up or down with respect to the first structure unit 24. Further, the second structure unit 34 has an extension member 35 extending downward and a plane member 38 extending in horizontal direction from the lower end of the extension member 35, and these are moved up or down integrally with the second structure unit 34. On the upper surface of the plane member 37, a flange 50F of the cylinder 50 is rotatably supported via a bearing 37B. Except the flange 50F, the cylinder 50 is designed in dual structure to guide the compressed gas just as in the cylinder 50 of the fifth embodiment, and it is arranged coaxially to the pulling shaft 1. As in the fifth embodiment, the cylinder 50 is rotated synchronously with the pulling shaft 1 by the structure shown in FIG. 11. Under the cylinder 50, there are provided, as in the fifth embodiment, the gripping arms 12A and 12B and the air cylinders 14A to 14D mounted on tips of the gripping arms.

The cylinder 50 can be rotated with respect to the mechanical chamber 18 via a ball bearing (not shown), and inner space of the mechanical chamber 18 is maintained in vacuum condition or filled with inert gas airtightly. Also, the space between the shaft 1 and the cylinder 50 is maintained in airtight condition by a sealing member (not shown).

Next, description will be given on operation of the single crystal pulling apparatus of FIG. 14, concentrating the description on the features different from those of the first embodiment. Polycrystal in the quartz crucible 10 under the mechanical chamber 18 is heated and melted. When the preparation for the pulling operation is completed, the first motor 20 is operated to move the first structure unit 24 down. Thus, the pulling shaft 1 is pulled downward in the figure, and the seed crystal 3 is immersed into the surface of the Si melt 11 in the quartz crucible 10 and is adapted to it. In this case, the arms 12A and 12B are at standby positions so that the air cylinders 14A to 14D at the tips are not in contact with the Si melt, and the air cylinders 14A to 14D are opened so that these do not come into contact with the portion with larger diameter 5, which is being pulled up (the condition shown in FIG. 14).

Next, after a predetermined time has elapsed, the first motor 20 is rotated in reverse direction, and the first structure unit 24 is moved up. By pulling up the seed crystal 3 at relatively high rate, a neck portion 4 with diameter of 3–4 mm is formed under the seed crystal 3. Then, the pulling rate is relatively slowed down, and a portion with larger diameter 5 for support is formed over a predetermined length under the neck portion 4. Then, the pulling rate is relatively slowed down and the formation of the crystal main portion 7 is started.

When the portion with larger diameter 5 is moved up to a predetermined height, the second motor 30 is driven to move the second structure unit down so that the contact member gripping arms 58 of the air cylinders 14A to 14D are positioned near the lateral sides of the portion with larger diameter 5, and the second motor 30 is stopped at a predetermined position. Next, a pump 62 is operated to send the compressed gas into the air cylinders 14A to 14D so that the contact members 58 are closed to grip the portion with larger diameter from lateral sides. In FIG. 14, the compressed gas is guided from the pump 62 via a valve 64 and a pipe 66 to a gas passage 50P of the cylinder 50. Under this condition, the contact members 58 grip the portion with larger diameter 5. Therefore, by rotating the first motor 20, the first structure unit 24 and the second structure unit 34 are integrally moved up, and the pulling shaft 1 is moved synchronously with the contact members 58. As explained in the fifth embodiment, the valve 64 is automatically closed to maintain the pressure.

Figure 15:
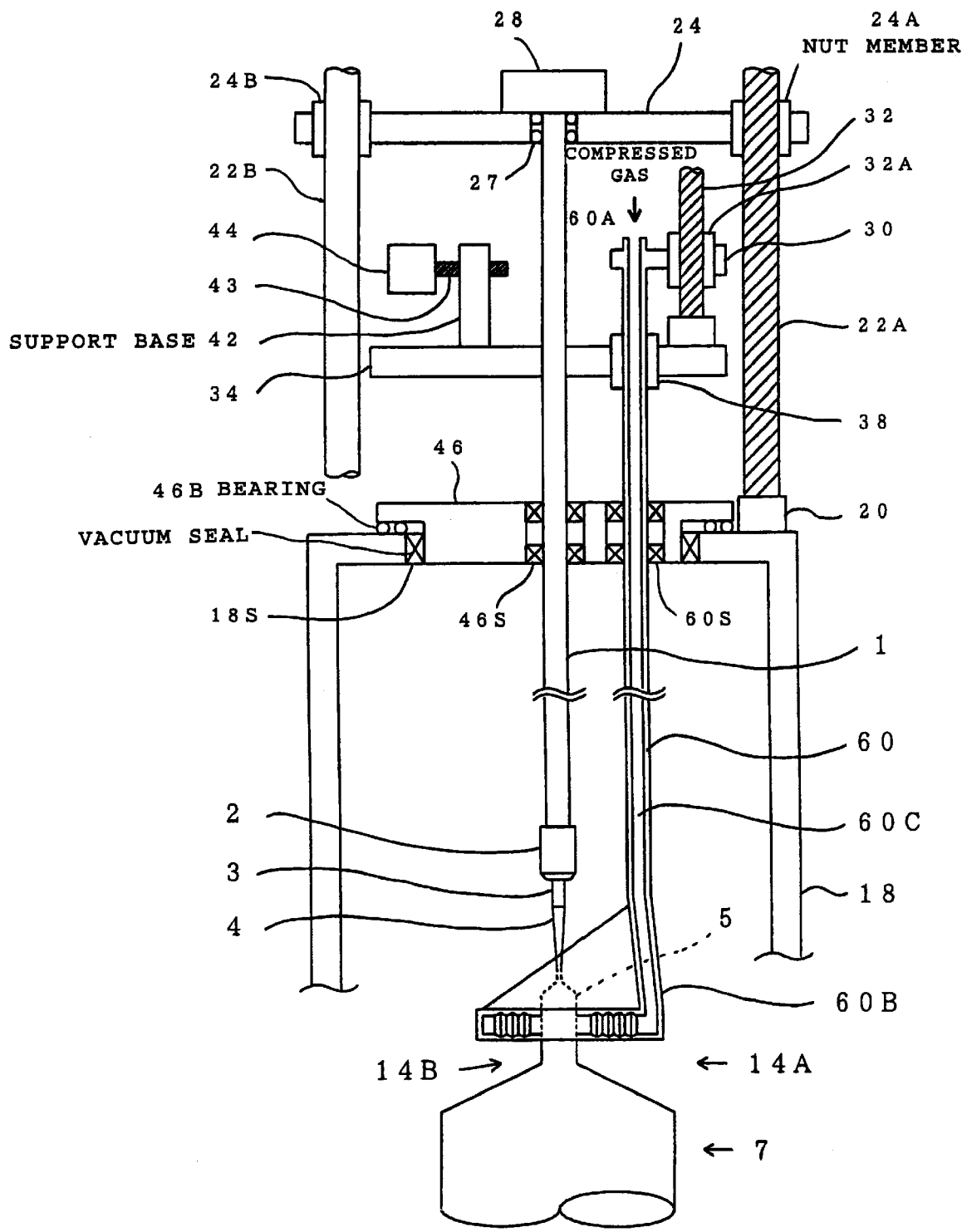
FIG. 15 is a partial cross-sectional view for schematically showing a seventh embodiment of a single crystal pulling apparatus of the present invention.

Next, description will be given on a seventh embodiment of the single crystal pulling apparatus of the present invention referring to FIG. 15. The seventh embodiment is a variation of the sixth embodiment. In FIG. 15, a seed crystal holder 2 is mounted at the tip of the pulling shaft 1, and the seed crystal 3 is mounted on the seed crystal holder 2. These features are the same as those of the sixth embodiment. The shaft 1 is rotatably arranged by the motor 28 mounted on the first structure unit 24, which can be moved up or down with respect to the mechanical chamber 18, serving as a stationary member. The first structure unit 24 has a screw unit 24A (nut unit) with internal thread, and this screw unit 24A is engaged with a rod 22A with external thread, which is rotated by the first motor 20 mounted on the mechanical chamber 18. Therefore, by the rotation of the first motor 20, the first structure unit 23, the motor 28 mounted on it and the shaft 1 can be moved up or down with respect to the quartz crucible 10. Reference symbol 22B represents a guide rod, and it is slidably mounted on the first structure unit 24 via a slider 24B.

The pulling shaft 1 is extending downward from the first structure unit 24, and a second structure unit 34 is fixed on outer periphery of the pulling shaft 1. on the second structure unit 34, a second motor 30 for rotating the rod 32 with external thread is mounted. Also, a crystal support shaft 60 is slidably supported on the second structure unit 34 via a slider 38. On the crystal support shaft 60, a nut member 32A screwed on the rod 32 with external thread is fixed. On the second structure unit 34, a balance weight 44 is mounted via a support base 42 and a balanced weight position adjusting member 43.

Figure 12:
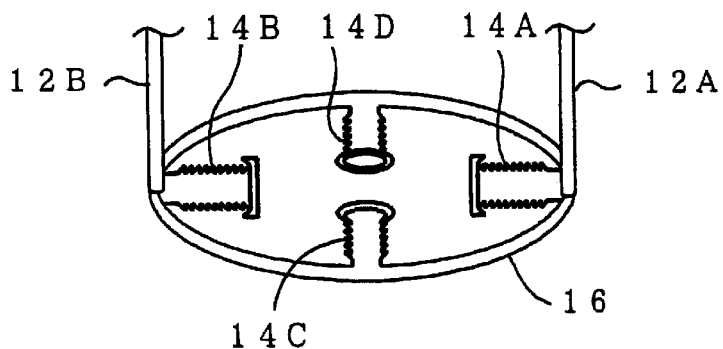
FIG. 12 is a perspective view showing relationship between arms and air cylinders in the fifth embodiment.

The pulling shaft 1 and the crystal support shaft 60 are arranged in parallel to each other, and these are extending into the mechanical chamber 18 through a rotary plate 46. The rotary plate 46 is rotatably supported on the mechanical chamber 18 via a bearing 46B. Reference numerals 18S, 46S and 60S represent a sealing member respectively. On the lower end of the crystal support shaft 60, a plurality of air cylinders 14A and 14B are mounted. The structure of these air cylinders are essentially the same as those of the first and the sixth embodiments. As shown in FIG. 12, there are provided four air cylinders 14A to 14D arranged in radial direction. In the seventh embodiment, the crystal support shaft 60 is not designed as coaxial to the pulling shaft 1 and it is rotated around the pulling shaft 1. The crystal support shaft 60 is designed in hollow structure, and the hollow portion serves as a compressed air passage 60C, through which compressed air is supplied to each of the air cylinders 14A and 14B. Because the crystal support shaft 60 is rotated together with the second structure unit 34, i.e. together with the pulling shaft 1, the contact members at the tips of the air cylinders 14A and 14B are rotated synchronously with the portion with larger diameter 5.

Next, description will be given on operation of the single crystal pulling apparatus of FIG. 15, concentrating the description on the features different from those of the second embodiment. Polycrystal in the quartz crucible 10 placed under the mechanical chamber 18 is heated and melted. When the preparation for the pulling operation is completed, the first motor 20 is operated at first to move the first structure unit 24 down. The shaft 1 is moved downward in the figure, and the seed crystal 3 is immersed into the surface of the Si melt 11 in the quartz crucible. In this case, the crystal support shaft 60 stands by at such a position that the air cylinders 14A to 14D do not come into contact with the Si melt 11, and the contact members 58 are opened so that the contact members do not come into contact with the portion with larger diameter 5, which is being pulled.

Next, after a predetermined time has elapsed, the first motor is rotated in reverse direction to move the first structure unit 24 up. By pulling up the seed crystal 3 at relatively high rate, a neck portion 4 with diameter of 3–4 mm is formed under the seed crystal 3. Then, the pulling rate is relatively slowed down and a portion with larger diameter 5 for support is formed over a predetermined length under the neck portion 4. Then, the pulling rate is relatively slowed down, and the formation of the crystal main portion 7 is started. When the portion with larger diameter 5 is moved up to a predetermined height, the second motor 30 is operated so that the contact member gripping arms 58 of the air cylinders 14A to 14D are positioned near the lateral sides of the portion with larger diameter 5. Then, the second structure unit 34 is moved down, and the second motor 30 is stopped at a predetermined position. Next, the compressed gas is sent into the air cylinders 14A to 14D so that the contact members 58 are closed to grip the portion with larger diameter 5. Thereafter, by rotating the first motor 20, the first structure unit 24 and the second structure unit 34 are integrally moved up, and the pulling shaft is synchronously moved up with the contact members 58.

In the fifth to the seventh embodiments as described above, the timing to move the second structure unit 34 down or the timing to operate the air cylinders 14A to 14D may be determined visually, while it is possible to determine the timing and to automatically control by finding diameter of the single crystal using a CCD camera, for example, and by performing image processing of output signals. Or, it is possible to rely on visual confirmation of the operator after determining the timing by the automatic control. Also, the contact of the contact members 58 with the portion with larger diameter 5 can be detected by detecting using optical sensor. In this case, the air cylinders 14A to 14D and the members in contact with these cylinders are used as an electric current route.

In the fifth to the seventh embodiments, the lateral sides of the portion with larger diameter 5 are gripped by the air cylinders, while it is possible to use gas other than the air.

Also, the same effect can be attained not only by the gas pressure driving unit but also by a hydraulic driving unit. In the fifth to the seventh embodiments as described above, it is designed that the shaft 1 is synchronously rotated with the contact members 58, but the arrangement is not limited to this, and a combination of a gear with belt or pulley may be used.

INDUSTRIAL APPLICABILITY

As explained in the above, according to the present invention, after the mechanism for gripping or supporting the portion with larger diameter of the single crystal formed under the seed crystal grips or supports the portion with larger diameter, motive power for pulling up the seed crystal is transmitted to the mechanism for gripping or supporting the portion with larger diameter, and the mechanism for gripping or supporting the seed crystal and the portion with larger diameter is moved by a single pulling driving source. As a result, control can be achieved in simple manner and the arrangement is not complicated, and pulling operation can be carried out at low cost and in stable manner. Also, by the shock absorber provided on the pulling shaft, the single crystal can be moved in smooth and soft manner from the pulling shaft to the gripping or supporting mechanism.

The use of the bellows chamber makes it possible to have the arrangement more simple and to set the height of the entire single crystal pulling apparatus to a lower level.

Also, by detecting that the gripping members come into contact with the portion with larger diameter of the single crystal being pulled or that these are at a position to contact with each other using a detection circuit or a sensor and by gripping the constricted portion, it is possible to grip automatically. As a result, the timing to grip the portion with larger diameter can be determined without troublesome procedure by the staffs, and the single crystal of large diameter and heavy weight can be pulled up in safe and reliable manner.

According to another aspect of the present invention, after the mechanism for gripping lateral sides of the portion with larger diameter of the single crystal formed under the seed crystal has gripped the portion with larger diameter, motive power for pulling up the seed crystal is transmitted to the mechanism for gripping the portion with larger diameter, and the mechanism for gripping the seed crystal and the portion with larger diameter is moved up by a single pulling driving source of the dislocation-free shaft. This makes it possible to control in simple manner and to move self-weight of the single crystal in smooth and soft manner, and to carry out the pulling operation with simple arrangement, at low cost, and in stable manner. Also, the driving mechanisms are arranged outside the vacuum chamber, and this makes it possible to exclude the influence under high temperature and to avoid the problem of particles intermingling into the vacuum chamber. Further, shock absorber is provided on the pulling shaft, and the single crystal can be moved in smooth and soft manner.

What is claimed is:

1. A single crystal pulling apparatus, comprising:

rotating means for rotating a seed crystal holder to support a seed crystal above a crucible capable of holding a melted crystal;

seed crystal pulling means for pulling up said seed crystal at a controlled rate by pulling said seed crystal holder;

gripping members rotatable with said seed crystal holder, movable in vertical direction in association with vertical movement of said seed crystal holder having tips thereof opened or closed to grip a lower end of a constricted portion of said single crystal formed under a portion of said single crystal with larger diameter under said seed crystal by pulling of said seed crystal pulling means and/or said portion with a larger diameter of the single crystal;

crystal holding position control means for controlling position in vertical direction of said gripping members with respect to said seed crystal holder, and when it is out of said vertical position control operation, for moving up said gripping members integrally with said seed crystal holder by transmitting motive power of said seed crystal pulling means; and gripping member opening or closing means for opening or closing forward ends of said gripping members, and for moving tips of said gripping members to the lower portion of said portion with larger diameter so that the lower end of said constricted portion and/or said portion with larger diameter is gripped, whereby:

driving mechanisms of said means are positioned outside a vacuum chamber for storing said crucible and the single crystal to be grown.

2. A single crystal pulling apparatus, comprising:

a shaft connected to a seed crystal holder for supporting a seed crystal above a crucible capable of holding a melted crystal;

rotating means for rotating said shaft;

seed crystal pulling means for pulling said seed crystal at a controlled rate by pulling of said shaft;

gripping members rotatable with said shaft, movable in vertical direction in association with vertical movement of said shaft, and having forward ends thereof to grip the lower end of a constricted portion of said single crystal formed under a portion of said single crystal with larger diameter under said crystal seed by pulling of said seed crystal pulling means and/or said portion with larger diameter of the single crystal;

crystal holding position control means for controlling vertical position of said gripping members with respect to said shaft, and when it is out of said vertical position control operation, said gripping members are integrally moved in vertical direction with said shaft by transmitting motive power of said seed crystal pulling means; and gripping member opening or closing means for opening or closing forward ends of said gripping members, and for moving forward ends of said gripping members to the lower portion of said portion with larger diameter so that the lower ends of said constricted portion and/or said portion with larger diameter are gripped when forward ends of said gripping members are closed, whereby:

driving mechanisms of each of said means are positioned outside a vacuum chamber for storing said crucible and the single crystal to be grown.

3. A single crystal pulling apparatus according to claim 1 or 2, wherein said seed crystal pulling means comprises a first structure unit movable in vertical direction with respect to a stationary member fixed with respect to the position in vertical direction of said crucible, and a first driving unit for driving said first structure unit in vertical direction with respect to said stationary member and said rotating means is provided on said first structure unit.

4. A single crystal pulling apparatus according to claim 3, wherein said crystal holding position control means comprises a second structure unit movable in vertical direction with respect to said first structure unit and a second driving unit for driving said second structure unit in vertical direction with respect to said first structure unit, and said gripping members are connected to said second structure unit.

5. A single crystal pulling apparatus according to claim 4, wherein said gripping member opening and closing means comprises a third structure unit movable in vertical direction with respect to said second structure unit and a third driving unit for driving said third structure unit in vertical direction with respect to said second structure unit, and a link member for opening and closing said gripping members is connected to said third structure unit.

6. A single crystal pulling apparatus according to claim 1 or 2, wherein said gripping member opening and closing means is operated by gas pressure or by hydraulic pressure.

7. A single crystal pulling apparatus, comprising:

rotating means for rotating a seed crystal holder for supporting a seed crystal above a crucible capable of holding a melted crystal;

seed crystal pulling means for pulling said seed crystal at a controlled rate pulling by said seed crystal holder;

a support member capable to rotate with said seed crystal holder, movable in vertical direction in association with vertical movement of said seed crystal holder, and being provided with a through-hole to allow a constricted portion of said single crystal to pass and with a slit to communicate said through-hole with an outer peripheral portion to guide said constricted portion toward said through-hole in order to support a lower end of the constricted portion formed under a portion of said single crystal with larger diameter under said seed crystal by pulling of said seed crystal pulling means and/or said portion with larger diameter of the single crystal;

crystal holding position control means for controlling vertical position of said support member with respect to the position in vertical direction of said seed crystal holder, and when it is out of position control operation, said support member is moved in vertical direction integrally with said seed crystal holder by transmitting motive power of said seed crystal pulling means; and support member moving means for moving said support member between a first position not to support the lower end of said constricted portion and/or said portion with larger diameter and a second position to support the lower end of said constricted portion and/or said portion with larger diameter, whereby:

driving mechanisms of each of said means are positioned outside a vacuum chamber for storing said crucible and the single crystal to be grown.

8. A single crystal pulling apparatus, comprising:

a shaft connected to a seed crystal holder for supporting a seed crystal above a crucible capable of holding a melted crystal;

rotating means for rotating said shaft;

seed crystal pulling means for pulling said seed crystal at a controlled rate by pulling of said shaft;

a support member rotatable with said shaft, movable in vertical direction in association with vertical movement of said shaft, having a through-hole to allow a constricted portion of said single crystal to pass and a slit for communicating said through-hole with an outer peripheral portion to guide said constricted portion toward said through-hole in order to support a lower end of the constricted portion formed under a portion of said single crystal with larger diameter under said seed crystal by pulling of said seed crystal pulling means and/or said portion with larger diameter of the single crystal;

crystal holding position control means for controlling position in vertical direction of said support member with respect to the position in vertical direction of said shaft, and when it is out of vertical position control operation, said support member is moved in vertical direction integrally with said shaft by transmitting motive power of said seed crystal pulling means; and support member moving means for moving said support member between a first position not to support the lower end of said constricted portion and/or the portion with larger diameter and a second position to support the lower end of said constricted portion and/or said portion with larger diameter, whereby:

driving mechanisms of each of said means are positioned outside a vacuum chamber for storing said crucible and the single crystal to be grown.

9. A single crystal pulling apparatus according to claim 2 or 8, wherein a shock absorber is provided on a part of said shaft.

10. A single crystal pulling apparatus according to claim 9, wherein said shock absorber comprises one or more of compression rubber, tension rubber, compression spring or tension spring.

11. A single crystal pulling apparatus according to claim 7 or 8, wherein said seed crystal pulling means comprises a first structure unit movable in vertical direction with respect to a stationary portion fixed with respect to the position in vertical direction of said crucible and a first driving unit for driving said first structure unit with respect to said stationary portion, and said rotating means is provided on said first structure unit.

12. A single crystal pulling apparatus according to claim 11, wherein, when said first structure unit is moved in vertical direction with respect to the position of said crucible, said structure unit is connected to bellows to expandably define a chamber above said crucible.

13. A single crystal pulling apparatus according to claim 11, wherein said crystal holding position control means comprises a second driving unit for driving said support base in vertical direction with respect to said first structure unit.

14. A single crystal pulling apparatus according to claim 7 or 8, wherein said support base moving means has means for rotating said support base in horizontal direction.

15. A single crystal pulling apparatus according to claim 11, further comprising a second structure unit on which said support member moving means is mounted, a balance weight being mounted on said second structure unit.

16. A single crystal pulling apparatus according to claim 2, wherein there is further provided means for synchronous rotation of said gripping members and said gripping member opening and closing members by transmitting rotation of said shaft to said gripping members and said gripping member opening and closing means.

17. A single crystal pulling apparatus according to claim 16, wherein said synchronously rotating means transmits rotation of said shaft to said coaxially arranged member based on a projection or a graded step provided between said shaft and a member coaxially arranged with said shaft.

18. A single crystal pulling apparatus according to claim 16, wherein said synchronously rotating means comprises a gear or a belt and a pulley.

19. A single crystal pulling apparatus according to claim 16, wherein said synchronously rotating means comprises a motor serving as said rotating means, another motor for rotating said gripping members and said gripping member opening and closing means, and synchronous control means for electrically and synchronously rotating said motors.

20. A single crystal pulling apparatus according to claim 8, wherein there is further provided means for synchronous rotation by transmitting rotation of said shaft to said support base.

21. A single crystal pulling apparatus according to claim 20, wherein said synchronously rotating means is means for mounting said crystal holding position control means on a member integrally rotated with said shaft.

22. A single crystal pulling apparatus according to claim 1 or 2, wherein there are further provided contact detecting means for electrically detecting that tips of said gripping members are in contact with said single crystal based on formation of electric current route, and control means for controlling said gripping member opening and closing means based on an output signal of said contact detecting means.

23. A singe crystal pulling apparatus according to claim 1 or 2, wherein there are further provided load detecting means for detecting that a load of said single crystal is applied on tips of said gripping members, and control means for controlling said gripping member opening and closing means based on an output signal of said load detecting means.

24. A single crystal pulling means, comprising:

rotating means for rotating a seed crystal holder to support a seed crystal above a crucible capable of holding a melted crystal;

seed crystal pulling means for pulling said seed crystal at a controlled rate by pulling of said seed crystal holder;

gripping members rotatable with said seed crystal holder, movable in vertical direction in association with vertical movement of said seed crystal holder, and having tips for gripping lateral sides of a portion of said single crystal with larger diameter having a constant diameter formed above a body portion of said single crystal under said seed crystal and by pulling of said seed crystal pulling means;

crystal holding position control means for controlling the position in vertical direction of said gripping members with respect to said single crystal holder, and when it is out of vertical position control operation, said gripping members are integrally moved in vertical direction with said seed crystal holder by transmitting motive power of said seed crystal pulling means; and gripping member opening and closing means for opening and closing tips of said gripping members, and tips of said gripping members are moved to lateral sides of said portion with larger diameter so that lateral sides of said portion with larger diameter are gripped when tips of said gripping members are closed, whereby:

driving mechanisms of each of said means are positioned outside a vacuum chamber for storing said crucible and the single crystal to be grown.

25. A single crystal pulling apparatus, comprising:

a shaft connected to a seed crystal holder for supporting a seed crystal above a crucible capable of holding a melted crystal;

rotating means for rotating said shaft;

seed crystal pulling means for pulling said seed crystal at a controlled rate by pulling of said shaft;

gripping members rotatable with said shaft, movable in vertical direction in association with vertical movement of said shaft, and having tips thereof opened or closed to grip lateral sides of a portion of said single crystal with larger diameter having a constant diameter formed above a body portion of said single crystal under said seed crystal by pulling of said seed crystal pulling means;

crystal holding position control means for controlling position in vertical direction of said gripping members with respect to said shaft, and when it is out of said vertical position control operation, said gripping members are integrally moved with said shaft in vertical direction by transmitting motive power of said seed crystal pulling means; and gripping member opening and closing means for opening or closing tips of said, gripping members, and tips of said gripping members are moved to lateral sides of said portion with larger diameter to grip lateral sides of said portion with larger diameter when tips of said gripping members are closed, whereby:

driving mechanisms of each of said means are positioned outside a vacuum chamber for storing said crucible and the single crystal to be grown.

26. A single crystal pulling apparatus according to claim 24 or 25, wherein said seed crystal pulling means comprises a first structure unit movable in vertical direction with respect to a stationary member fixed with respect to vertical position of said crucible, and a first driving unit for driving said first structure unit in vertical direction with respect to said stationary member, whereby said rotating means is provided on said first structure unit.

27. A single crystal pulling apparatus according to claim 26, wherein said crystal holding position control means comprises a second structure unit movable in vertical direction with respect to said first structure unit and a second driving unit for driving said second structure unit in vertical direction with respect to said first structure unit, whereby said gripping members are connected to said second structure unit.

28. A single crystal pulling apparatus according to claim 27, wherein said gripping member opening and closing means is a driving unit for moving said gripping members in radial direction of said portion with larger diameter.

29. A single crystal pulling apparatus according to claim 28, wherein said driving unit is a gas pressure driving unit or a hydraulic pressure driving unit.

30. A single crystal pulling apparatus according to claim 28, wherein said driving unit is a gas pressure driving unit, and said gas pressure driving unit is arranged in such manner that the movable piston is moved in horizontal direction.

31. A single crystal pulling apparatus according to claim 28, wherein there are provided a plurality of said gas pressure driving units, and said plurality of gas pressure driving units are arranged in radial direction by and are fixed on a ring-like member.

32. A single crystal pulling apparatus according to claim 25, wherein said crystal holding position control means has a cylinder coaxial to said shaft.

33. A single crystal pulling apparatus according to claim 32, wherein said cylinder is designed in dual structure and for guiding compressed gas used for said gripping member opening and closing means via internal space of said cylinder.

34. A single crystal pulling apparatus according to claim 25, wherein said crystal holding position control means comprises a member which can be rotated around said shaft and is extended approximately in parallel to said shaft.

35. A single crystal pulling apparatus according to claim 34, wherein said extension member is designed in tubular shape and has such a structure that compressed gas used for said gripping member opening and closing means is guided via internal space of said extension member.

36. A single crystal pulling apparatus according to claim 34, wherein a balance weight is arranged on a part of said first structure unit.

37. A single crystal pulling apparatus according to claim 25, wherein there is further provided means for synchronous rotation by transmitting rotation of said shaft to said gripping members.

38. A single crystal pulling apparatus according to claim 37, wherein said synchronously rotating means transmits rotation of said shaft to said coaxially arranged member based on a projection or a graded step provided between said shaft and a member arranged coaxially to said shaft.

39. A single crystal pulling apparatus according to claim 37, wherein said synchronously rotating means comprises a second structure unit fixed on said shaft, said crystal holding position control means is rotatable around said shaft and has a member extending approximately in parallel to said shaft, and said extension member is mounted on said second structure unit in such manner that it can be moved in vertical direction.

40. A single crystal pulling apparatus according to claim 37, wherein said synchronously rotating means comprises a gear or a belt and a pulley.

41. A single crystal pulling apparatus according to claim 28, wherein there is provided a valve for automatically closing a passage to maintain a predetermined value when gas pressure or hydraulic pressure supplied from said gas pressure driving unit or said hydraulic driving unit exceeds said predetermined value.

* * * * *